（12） United States Patent
Hutchison

(10) Patent No.: US 7,664,469 B2
(45) Date of Patent: Feb. 16, 2010

(54) CASING FOR A PORTABLE COMMUNICATION DEVICE

(75) Inventor: Mark Hutchison, Headley (GB)

(73) Assignee: Vertu Limited, London (GB)

( * ) Notice: Subject to any disclaimer, the term of this patent is extended or adjusted under 35 U.S.C. 154(b) by 1327 days.

(21) Appl. No.: 10/451,694

(22) PCT Filed: Dec. 21, 2001

(86) PCT No.: PCT/GB01/05740

§ 371 (c)(1),
(2), (4) Date: Dec. 19, 2003

(87) PCT Pub. No.: WO02/054846

PCT Pub. Date: Jul. 11, 2002

(65) Prior Publication Data

US 2004/0102229 A1 May 27, 2004

(30) Foreign Application Priority Data

Dec. 29, 2000 (GB) ................................. 0031790.9

(51) Int. Cl.
*H04B 1/38* (2006.01)
*H04M 1/00* (2006.01)
(52) U.S. Cl. ................. 455/90.3; 455/575.1; 455/575.8
(58) Field of Classification Search .............. 455/575.8, 455/575.1, 550.1, 90.3; 361/679, 724, 725, 361/726
See application file for complete search history.

(56) References Cited

U.S. PATENT DOCUMENTS

| 5,235,636 | A |   | 8/1993 | Takagi et al. ................ 379/368 |
| 5,237,607 | A | * | 8/1993 | Diamantis ................... 379/419 |
| 5,745,566 | A | * | 4/1998 | Petrella et al. ......... 379/433.13 |
| 5,768,370 | A |   | 6/1998 | Maatta et al. ................ 379/433 |
| 5,982,881 | A | * | 11/1999 | Mischenko ............ 379/433.11 |
| 6,728,555 | B1 | * | 4/2004 | Pirila et al. .................. 455/566 |
| 6,904,300 | B1 | * | 6/2005 | Maattanen et al. ........ 455/575.1 |
| 7,006,349 | B2 | * | 2/2006 | Nuovo et al. ................ 361/679 |
| 7,027,844 | B2 | * | 4/2006 | Nuovo ....................... 455/575.1 |
| 2001/0018332 | A1 | * | 8/2001 | Lustila et al. ................. 455/90 |
| 2004/0077391 | A1 | * | 4/2004 | Nuovo et al. ............. 455/575.8 |
| 2004/0096054 | A1 | * | 5/2004 | Nuovo ..................... 379/433.01 |
| 2004/0102208 | A1 | * | 5/2004 | Nuovo et al. ............. 455/550.1 |
| 2004/0102230 | A1 | * | 5/2004 | Nuovo ....................... 455/575.1 |
| 2004/0102231 | A1 | * | 5/2004 | Nuovo ....................... 455/575.1 |
| 2004/0102232 | A1 | * | 5/2004 | Nuovo ....................... 455/575.1 |
| 2004/0109560 | A1 | * | 6/2004 | Nuovo et al. ................. 379/440 |
| 2004/0114318 | A1 | * | 6/2004 | Nuovo et al. ................ 361/683 |
| 2004/0114754 | A1 | * | 6/2004 | Nuovo ..................... 379/428.01 |
| 2004/0116147 | A1 | * | 6/2004 | Nuovo ....................... 455/550.1 |
| 2004/0147294 | A1 | * | 7/2004 | Nuovo ....................... 455/575.1 |
| 2004/0246663 | A1 | * | 12/2004 | Nuovo et al. ................ 361/679 |

(Continued)

FOREIGN PATENT DOCUMENTS

DE        2747536 A      4/1979

(Continued)

*Primary Examiner*—Quochien B Vuong
(74) *Attorney, Agent, or Firm*—Harrington & Smith, PC

(57) ABSTRACT

The invention relates to personal communications devices and housings for such devices. The casing includes a front face that needs protection and is supported by a substrate that is gripped between an overlaying any underlaying part to secure it in position.

32 Claims, 19 Drawing Sheets

U.S. PATENT DOCUMENTS

2005/0124393 A1 * 6/2005 Nuovo et al. ............. 455/575.1

FOREIGN PATENT DOCUMENTS

| | | | |
|---|---|---|---|
| EP | 0878942 | A | 11/1998 |
| EP | 1030498 | A2 * | 8/2000 |
| EP | 1157799 | A1 | 11/2001 |
| GB | 2192084 | A | 12/1987 |
| GB | 2285518 | A | 7/1995 |
| GB | 2331888 | A | 6/1999 |
| JP | 4235443 | | 8/1992 |
| JP | 11087940 | | 3/1999 |
| WO | WO92/01250 | | 1/1992 |
| WO | WO-00/56040 | A1 | 9/2000 |
| WO | WO-02/49323 | A1 | 6/2002 |

* cited by examiner

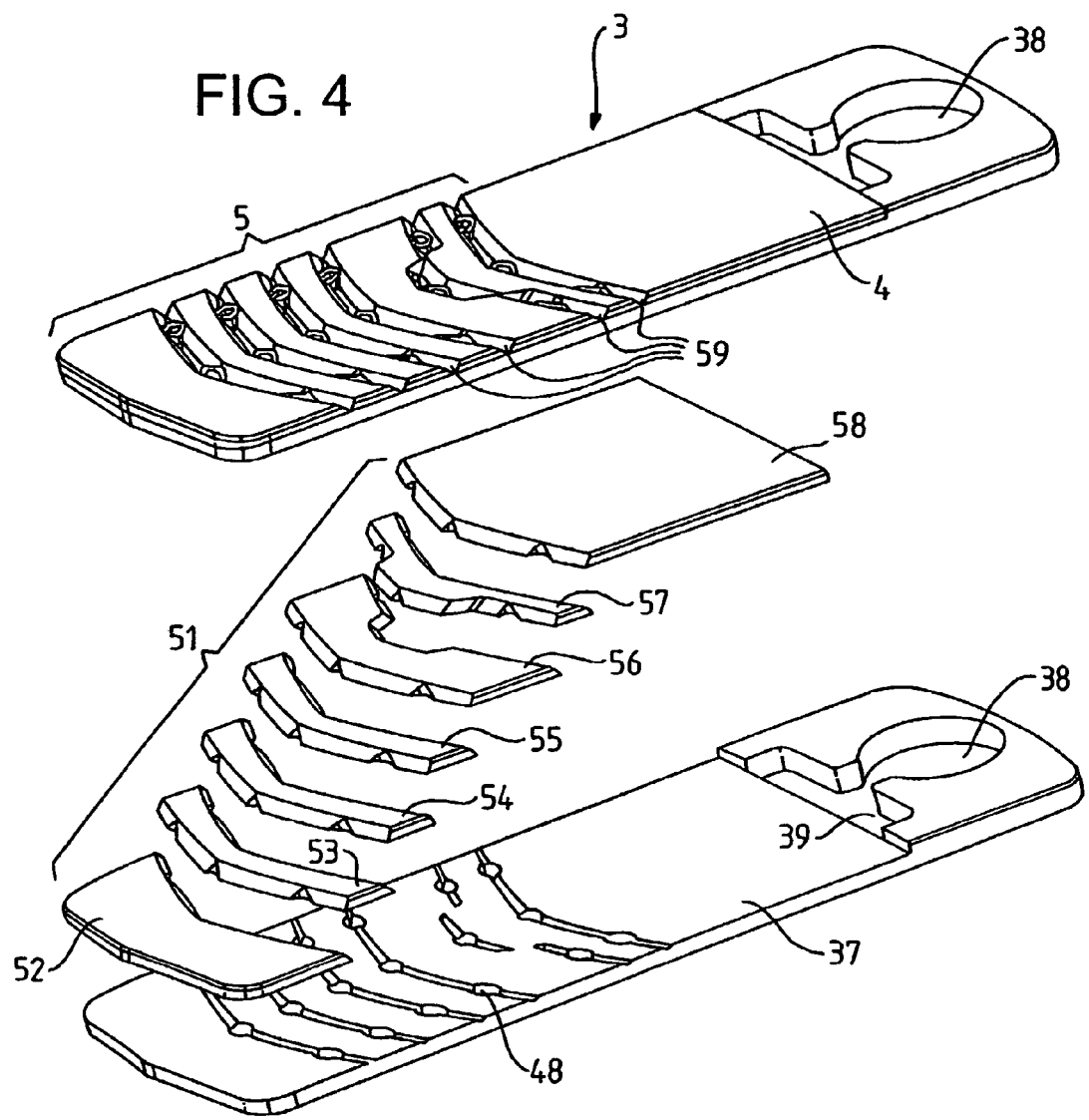
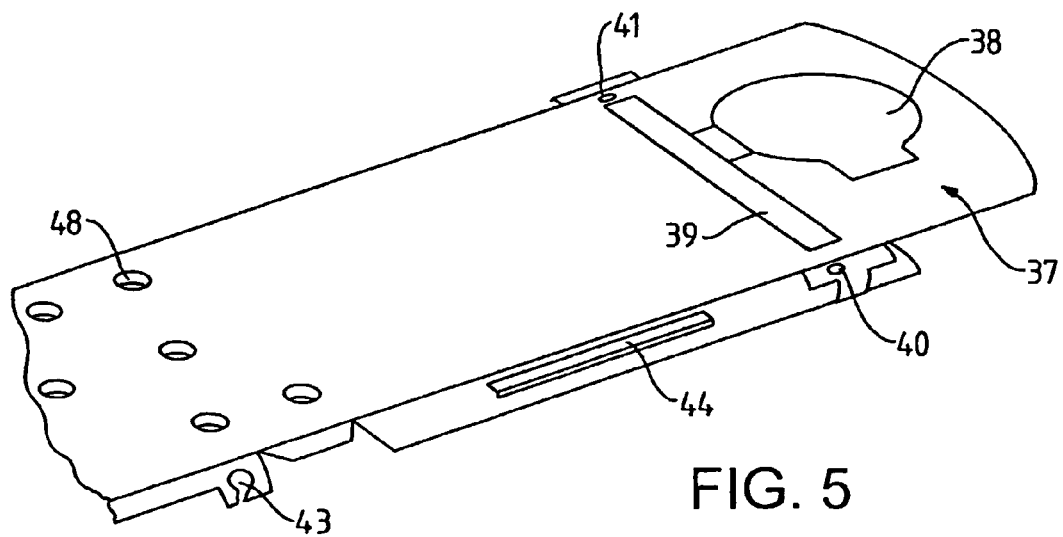

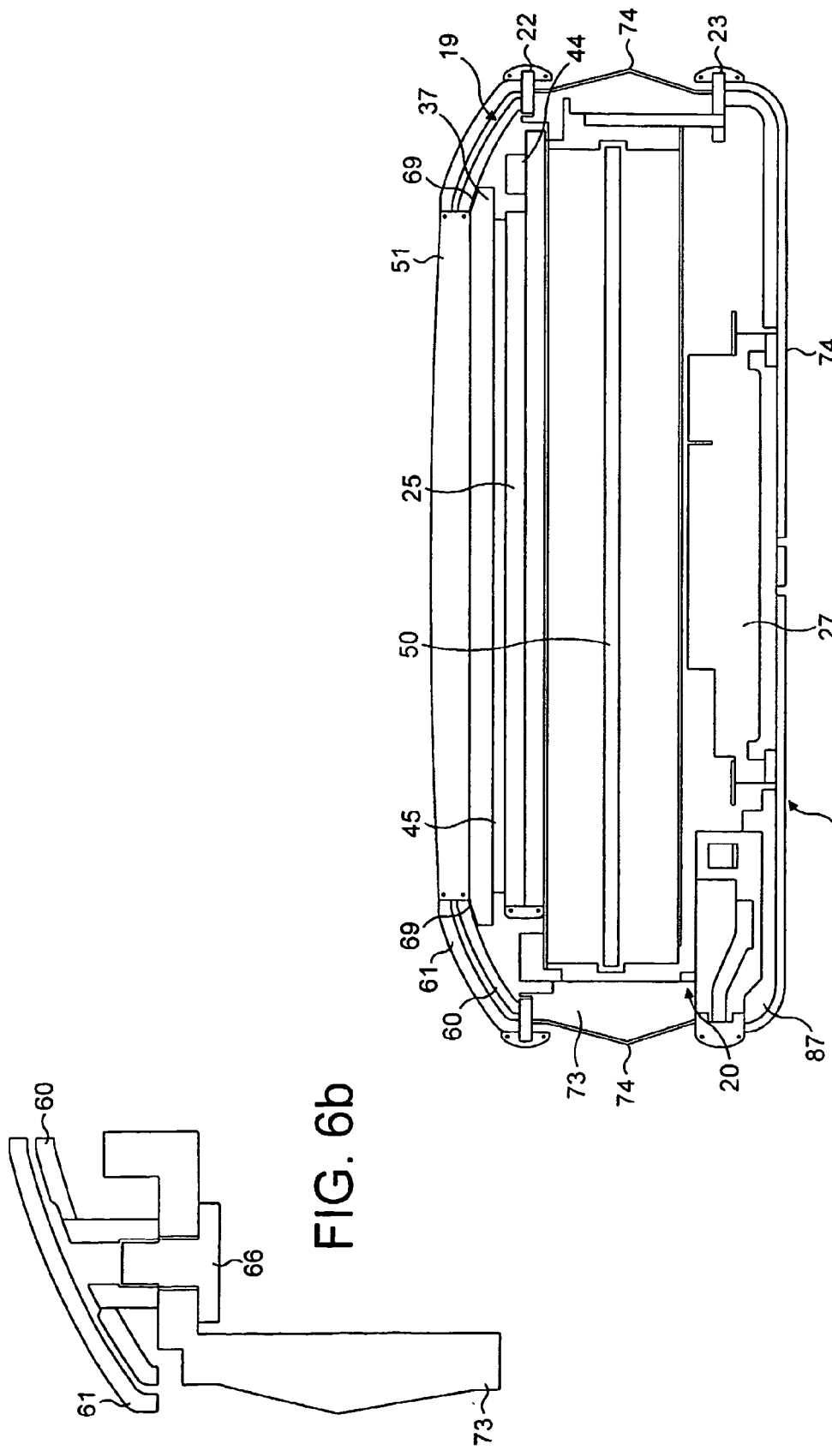

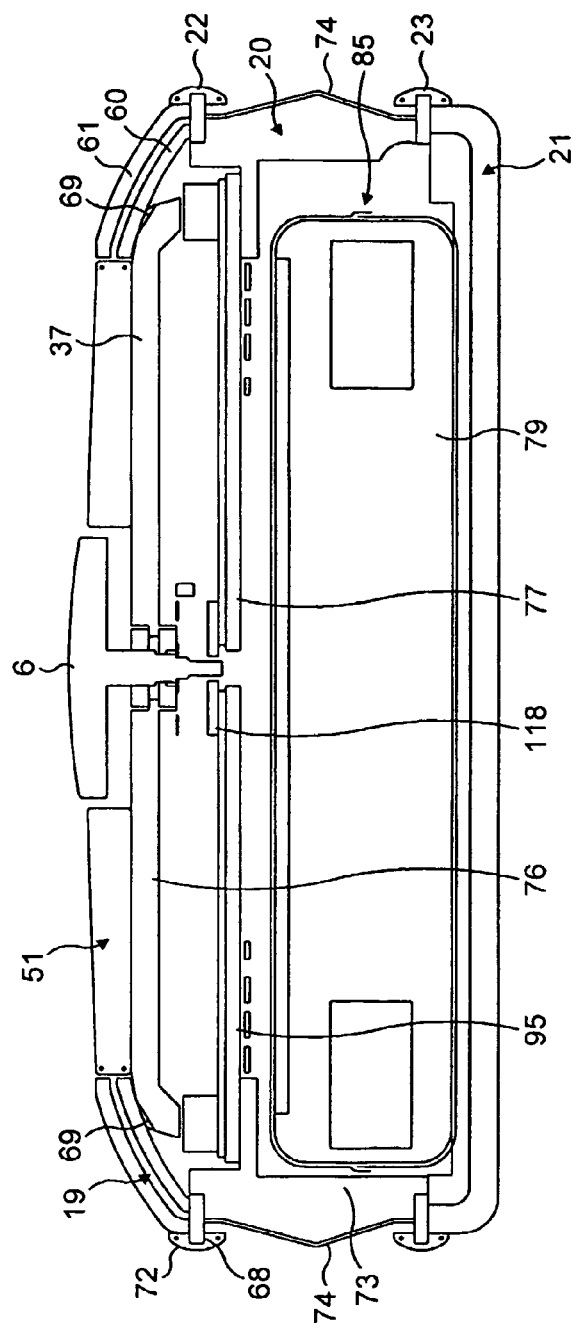
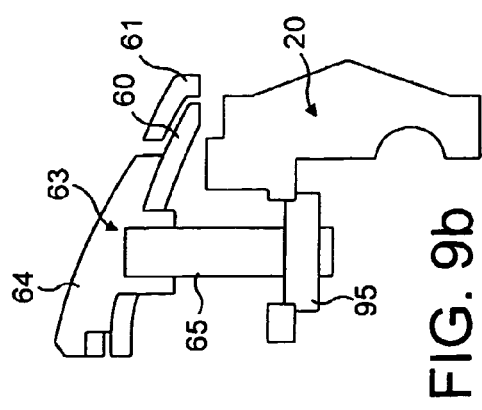
FIG. 9a
FIG. 9b

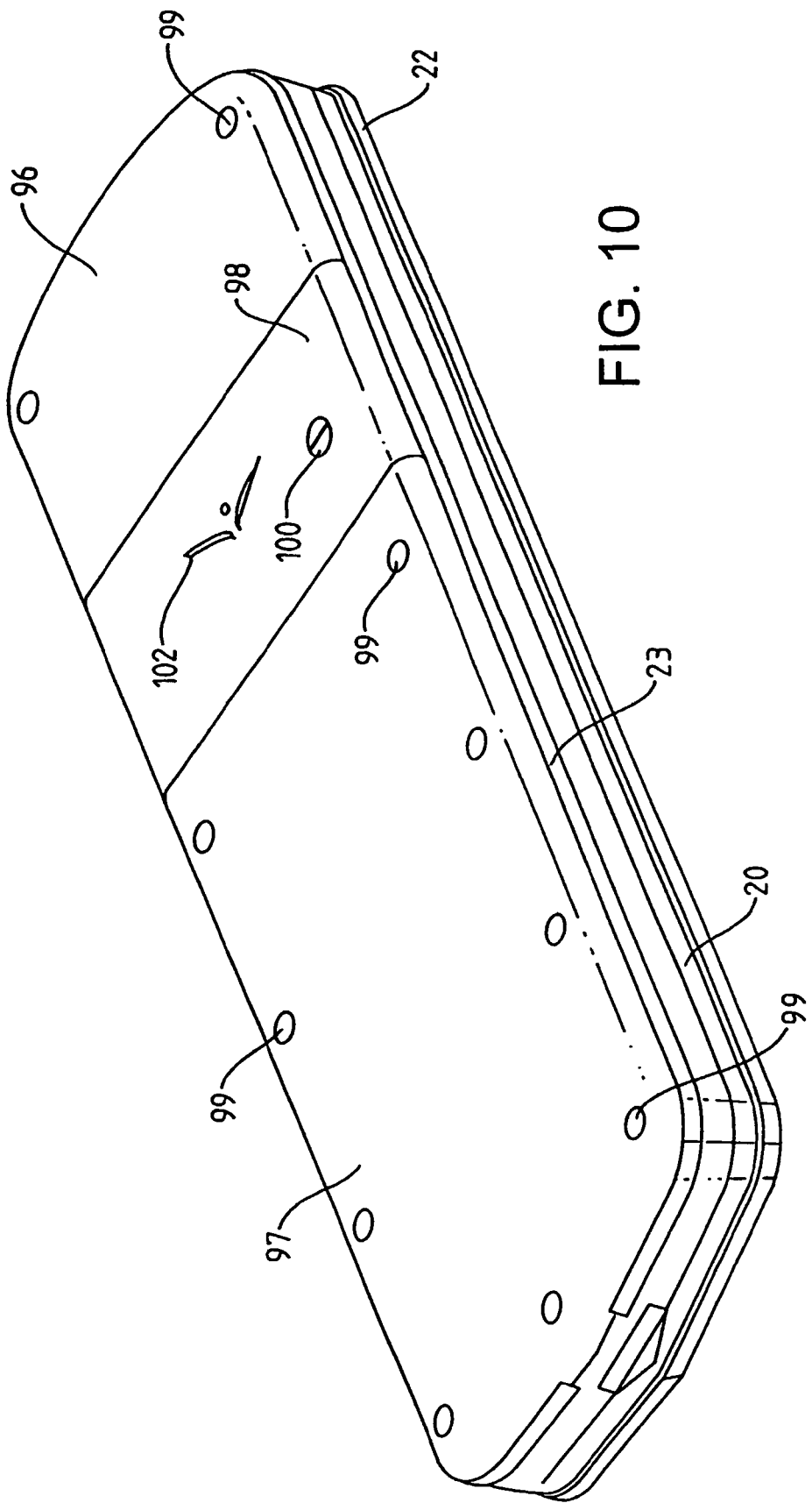

CASING FOR A PORTABLE COMMUNICATION DEVICE

FIELD OF THE INVENTION

The invention relates to personal communications devices and housings for such devices.

BACKGROUND OF THE INVENTION

Over recent years, personal communications devices ranging from mobile phones to electronic diaries and beyond have moved from being elite items to everyday tools. In all these years, however, the design criteria for the casing for the pieces of equipment have not really changed.

Communications devices of this type have casings designed with ease of assembly, durability, and cost, amongst other things in mind. From the first, casings have typically been formed from moulded parts as these lend themselves particularly to automated manufacture and can be easily automatically clipped together for assembly. The plastic materials used are also relatively flexible and consequently resilient against the knocks and drops that will inevitably be encountered by a highly utilized personal portable device. The design criteria have led to similar types of casing being used for all such devices.

SUMMARY OF THE INVENTION

In accordance with the present invention there is provided a casing for a portable communication device for receiving an engine for operation of the device, the casing comprising: a surface layer mounted on a defined area of a substrate leaving exposed areas; a housing defining, along with the surface layer, an exterior of the housing; and means for engaging the exposed areas of the substrate with the housing.

The introduction of non-conventional materials provide problems in design that need to be overcome. The present invention allows the design criteria for the casing to be relaxed and, in particular, different materials to be used. When constrained by conventional thinking, the casing is made from conventional materials.

By providing a surface layer mounted on a defined area of the substrate leaving exposed areas, an appropriate mounting can be achieved between the exposed areas of the substrate and the housing. There will consequently be less constraint on the type of material from which the surface layer can be formed.

The surface layer can conveniently be adhered to the substrate. The adherent may be a UV curing adhesive.

In embodiments of the invention the surface layer may provide an operating face of the device. This gives a design engineer far greater freedom to design a device with a desirable appearance. The operating face may be provided with a user input element, for example a key, or an array of such elements The casing may be a conventional one part casing or a clam shell, or other two or more part arrangement, where the user input elements or keys may be located on a different face to a display. In such two part arrangements generally respective casing portions are fixed such that one is movable relative to the other. The movement may be rotational or lateral.

The invention allows the opportunity for more brittle materials to provide a face of the casing. When the surface layer is brittle or easily catastrophically damaged, the manner in which the different elements interplay is important. This may seem an unlikely choice of characteristic for a material for a durable item but by allowing relatively brittle materials to provide a surface layer of such a device, materials including precious stones such as sapphire or diamond could be provided on the surface. Less costly options could also include materials such as glass or one of the huge number of ceramic materials that are available. Opening up the field from which materials of the casing and in particular the front surface can be selected allows many new design choices to be made.

By mounting a relatively brittle layer onto a substrate and engaging the substrate with further housing elements to provide a casing, the more delicate layer is strengthened by the substrate and does not need to be engaged itself with the rest of the housing. This reduces the chances of damaging the surface layer.

The surface layer and the housing can thereby be spaced one from the other so undesirable forces between parts are avoided to greater or lesser extent. When the surface layer is particularly prone to chipping, a flexible gasket may be provided to cushion the interface between edges of the surface layer and the rest of the casing.

When the surface layer is relatively brittle it may be preferable for the substrate to be flexible.

The brittle surface layer may be arranged on the substrate in segments with lateral discontinuities. These lateral discontinuities may extend across the full lateral extent of the surface layer to act as hinges. If the hinges run parallel to the minor axis of the face, the face will flex along its major axis, where most of the bending is likely to occur. The device will be protected against shattering in the event that the front face bends.

The lateral extending discontinuities can be shaped to receive keys of an array for user input. This provides an additional utility to the design as it allows the surface layer to be formed from machined pieces and attached to the substrate without compromising the visual impact of a device.

The keys may be individual keys retained in position by the substrate. It may be desirable to avoid contact between the keys and the surface layer as much as possible in order to protect the edges of the surface layer.

One method of mounting the substrate on the casing according to embodiments of the invention is to provide a housing element that overlays the substrate and captures the substrate between the overlay and the rest of the housing. The substrate may be squeezed or gripped between the overlay and the rest of the housing to retain it in position. A connector such as a screw or other suitable element may be provided to pull the overlay to the casing. The substrate may be gripped without the need for any securing elements to pass through the material of the substrate, ie the layers sandwiching the substrate are drawn together by a fastening member such as a screw or other suitable element capturing the substrate between them. As another option, however, the substrate itself could have apertures for receiving a fastening element such as a screw or other suitable element to attach it respectively to the overlay and the rest of the casing.

A rail designed to hide raw edges may also be caught in position as the parts are squeezed together.

The overlaying casing element may be a bezel that surrounds the surface layer and can then protect the exposed edges of that layer.

BRIEF DESCRIPTION OF THE DRAWINGS

Embodiments of the invention will now be described in more detail with reference to FIGS. 1 to 21 of the accompanying drawings of which:

FIG. 4 is an exploded view of the face of a communication device of one embodiment of the invention without keys;

FIG. 5 is a view of one layer of a light guide;

FIGS. 6a and 6b are sections through the communication device of FIG. 1 in the display region;

FIGS. 9a and 9b are sections through the communication device of FIG. 1 in the battery region;

FIG. 10 is a perspective view of the rear of the device with the battery cover in place;

DETAILED DESCRIPTION

Embodiments of the invention will be described in greater detail below with exemplary materials being given for some specific or individual elements of the device. Where a material or veneer is discussed in relation to an element, the particular character of the element described is one of many or several that may be provided as options to a party commissioning a personalised device in accordance with the invention. In addition the exact material or surface decoration of the element could be individually commissioned.

Figure 1:
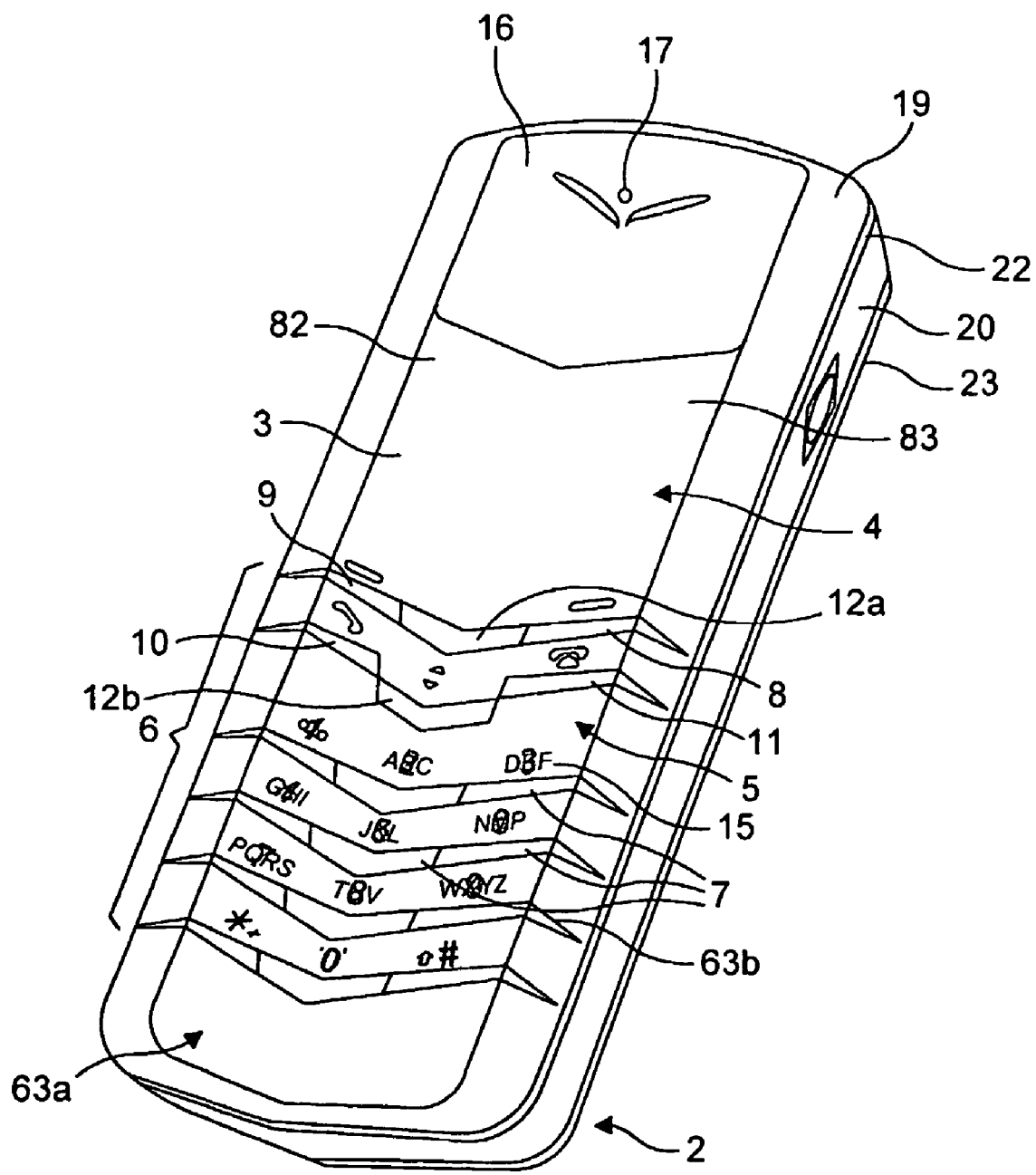
FIG. 1 is a perspective view of a communication device showing one embodiment of the invention.
Figure 2:
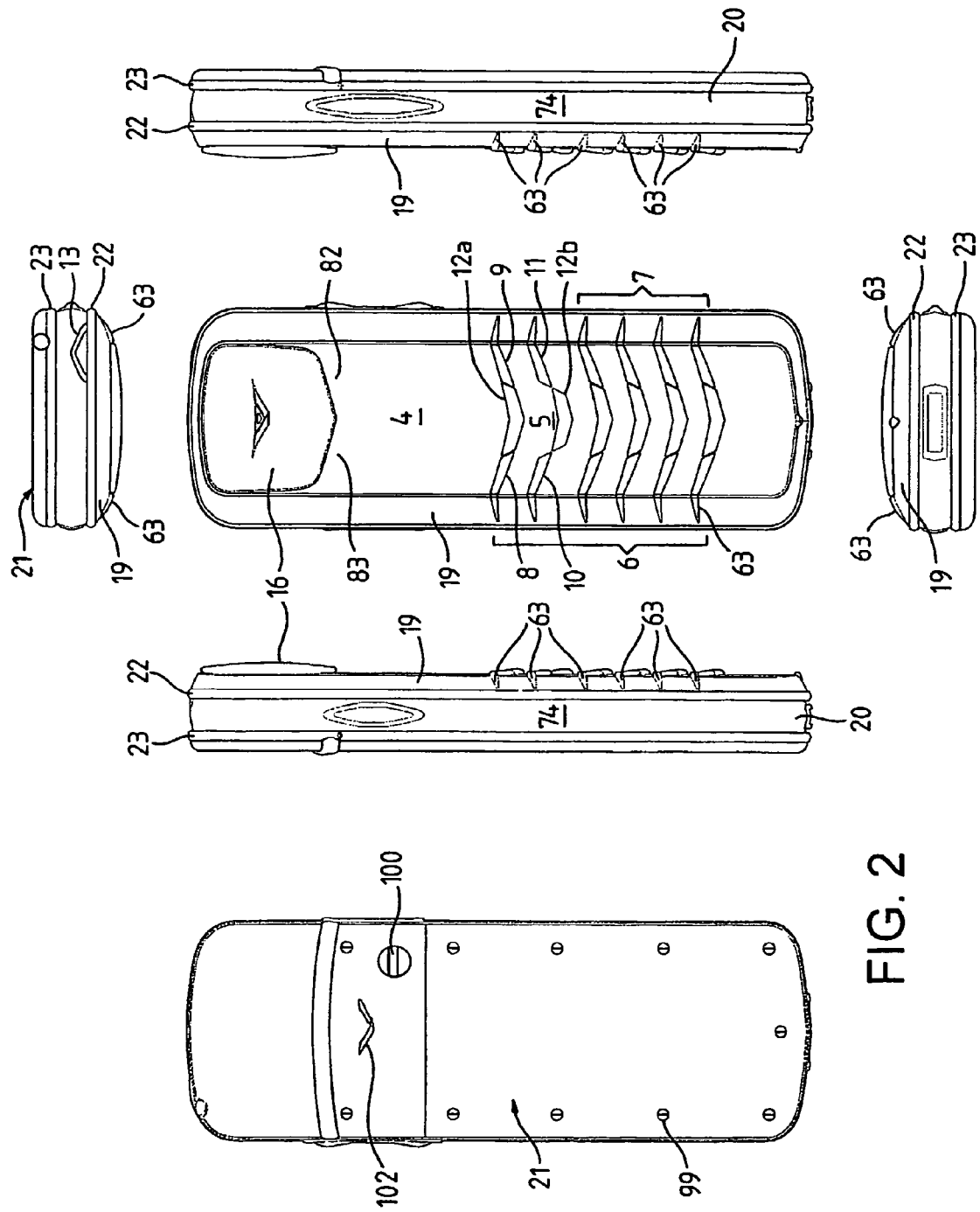
FIG. 2 shows front, rear, sides and top views of the communication device of FIG. 1.

The embodiment illustrated in FIG. 1 is a handheld communication device 1 with a precious retainable casing 2. The casing 2 of the device has been designed to be customisable to individual taste with precious materials. To enable individual devices to be created, the number of external parts that the casing is formed from is relatively large in contrast to existing communication devices.

The casing 2 has an optically permeable planar front face 3 providing a seamless transition from a display region 4 to an input region 5 that includes a key array 6. The key array 6 includes a first group of alphanumeric keys 7, for entering telephone numbers, writing text messages (SMS), writing names (associated with phone numbers), etc. Each of the twelve alphanumeric keys 7 is provided with a figure "0-9" or a sign "#" or "*", respectively. In an alpha mode each key is associated with a number of letters and special signs used in text editing. The key array 6 additionally comprises two soft keys 8, 9, two call handling keys 10, 11, two scroll keys 12, and an on/off key 13.

The functionality of the soft keys 8, 9 may depend on the state of the communication device and position within the menu accessed using the scroll keys 12. The current functionality of the soft keys 8, 9 can be shown in separate fields in the display region 4 just above the respective keys 8, 9.

The two call handling keys 10, 11 are used for establishing a call or a conference call, terminating a call or rejecting an incoming call.

The two direction keys or scroll keys 12, in the handset illustrated are placed centrally on the front surface of the communication device between the display region 4 and the group of alphanumeric keys 7 perform a scrolling function.

The seamless face 3 is formed from an optically seamless light guide 14 providing light to illuminate the display region 4 and key legends 15 located on the light guide 14 and associated with individual keys of the key array 6.

The front face 3 is overlaid with a pillow 16 providing apertures 17 to channel sound from a loud speaker 18 and providing an appropriate feel for an element of the device that will be located close to the user's ear. The front face 3 is surrounded by a bezel 19 that can be made from a precious metal. This acts to protect the edges of the light guide 14 and can help in some embodiments in securing the elements of the casing 2 together.

The keys of the key array in this particular embodiment are arranged to provide particular sensory guidance to the user. Aspects of the design also allow the light guide 14 to be made from a wide range of materials including those that are brittle and so need to be carefully handled and protected from shattering.

The casing 2 is formed from the front face 3 surrounded by the bezel 19, a side frame 20 and a back cover 21. The interface between the side frame 20 and the bezel 19 and the side frame 20 and the rear cover 21 are shielded by rails 22, 23 in this embodiment. The rails 22, 23 hide raw edges from view and exposure to ensure that the device 1 is both long lasting and elegant. The construction of the casing 2 enables the casing 2 to be opened with ease to update the engine 24 inside when desired. The casing 2 is also designed to allow the device to accommodate different sized and shaped engines 24, which may be necessary through its life.

Other elements of the design will be discussed in greater detail with reference to the later drawings. By way of introduction, the device will be briefly discussed with reference to its functional elements.

Figure 3:
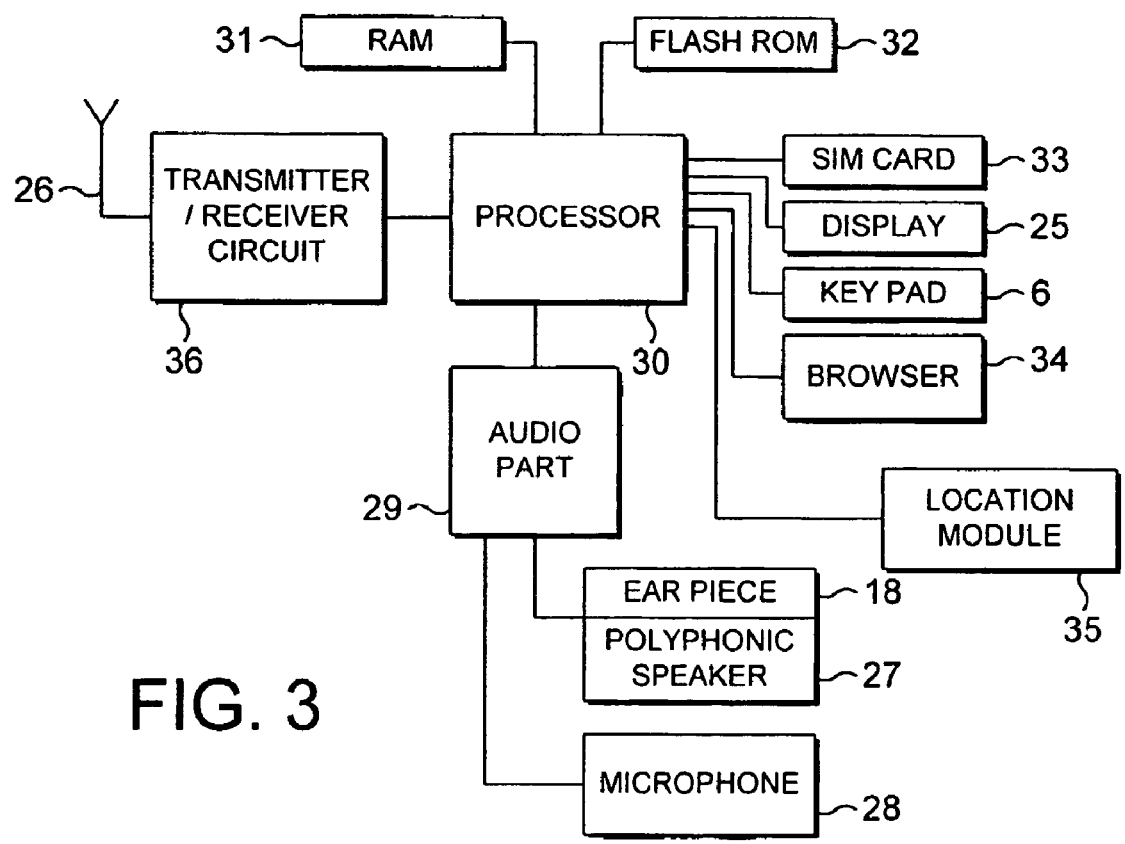
FIG. 3 is a schematic representation of a communication device suitable for embodiments of the present invention.
Figure 7:
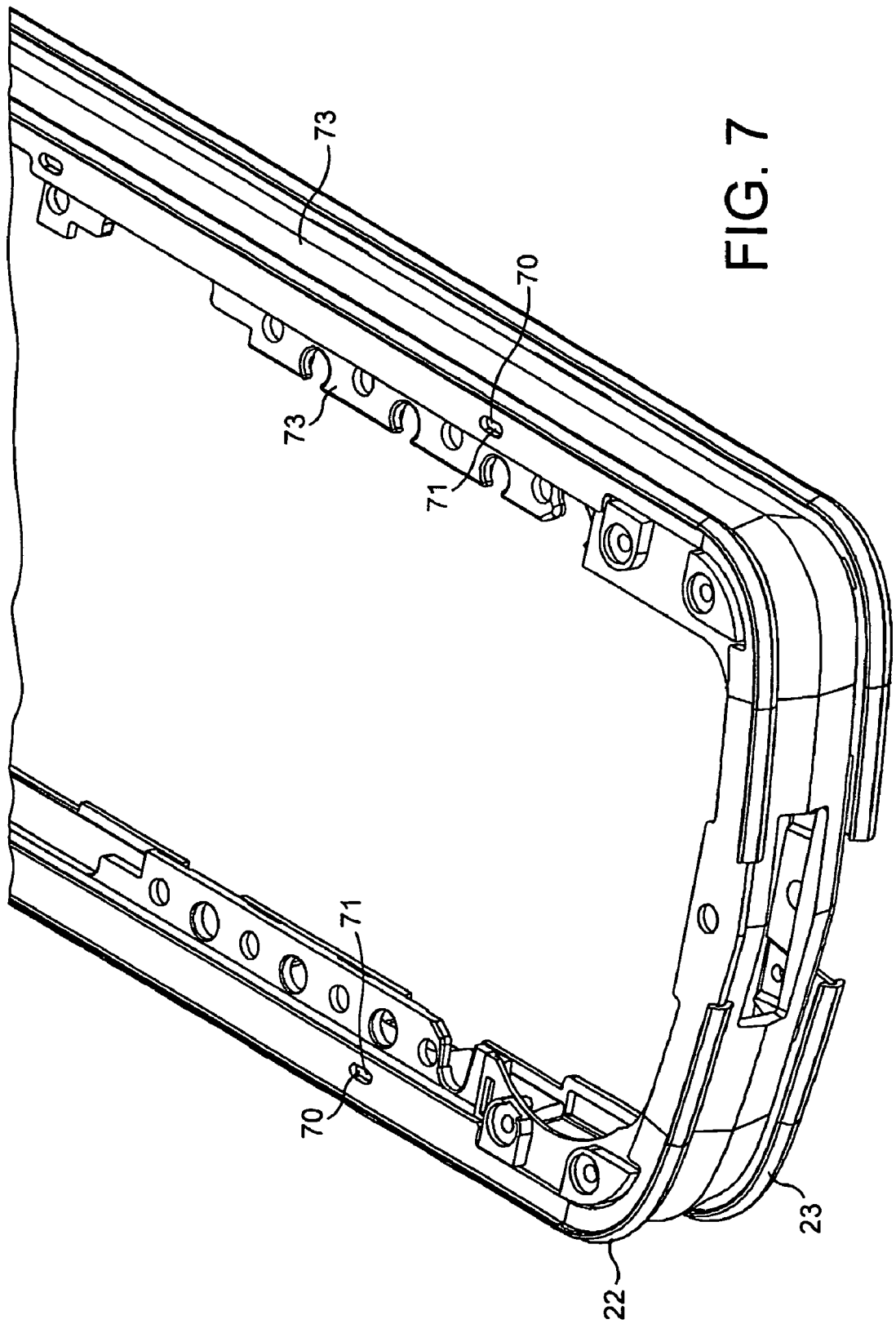
FIG. 7 is a perspective view of a side frame element and located rails for constructing a casing
Figure 8:
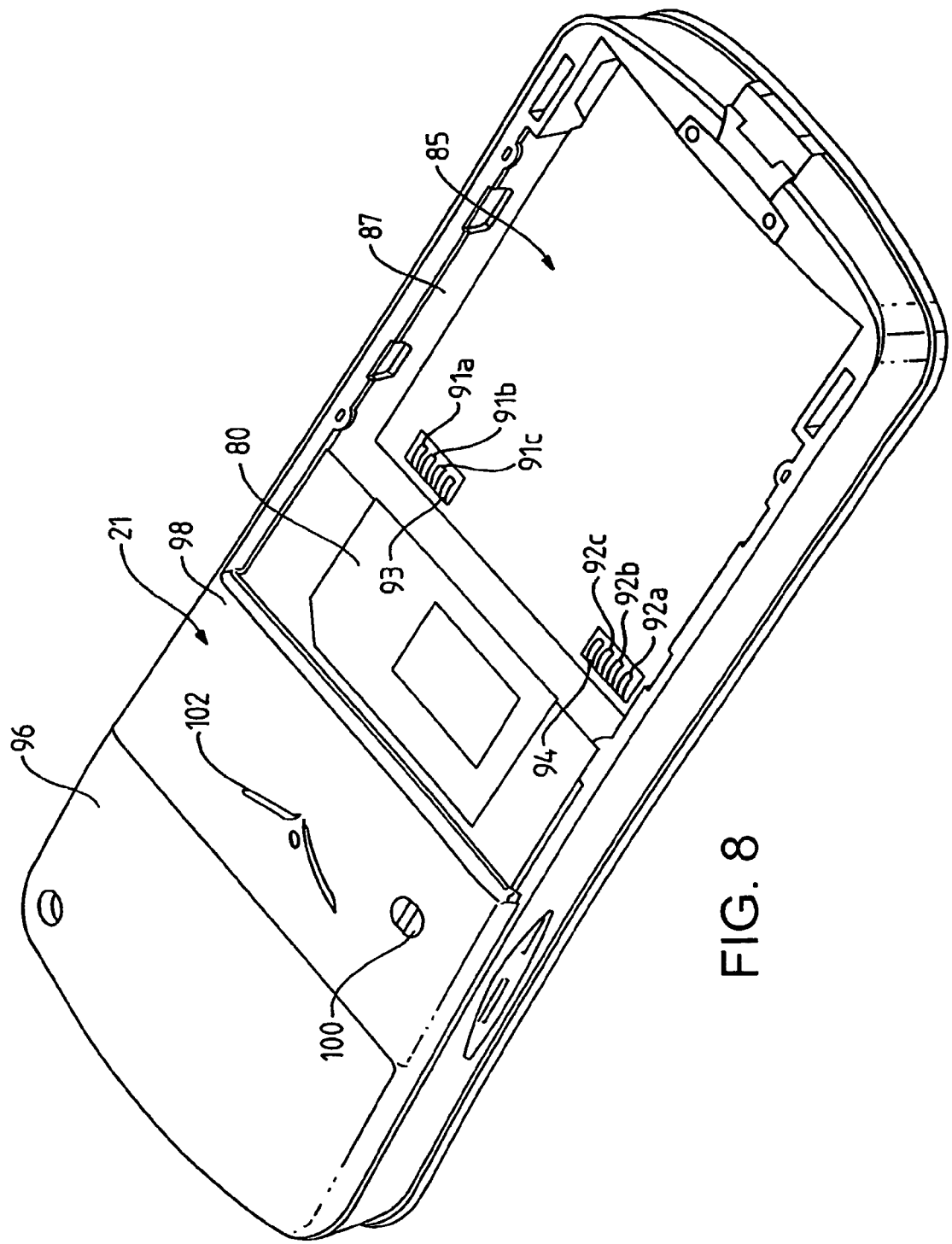
FIG. 8 is a perspective view of the rear of the device with the battery cover removed.
Figure 11A:
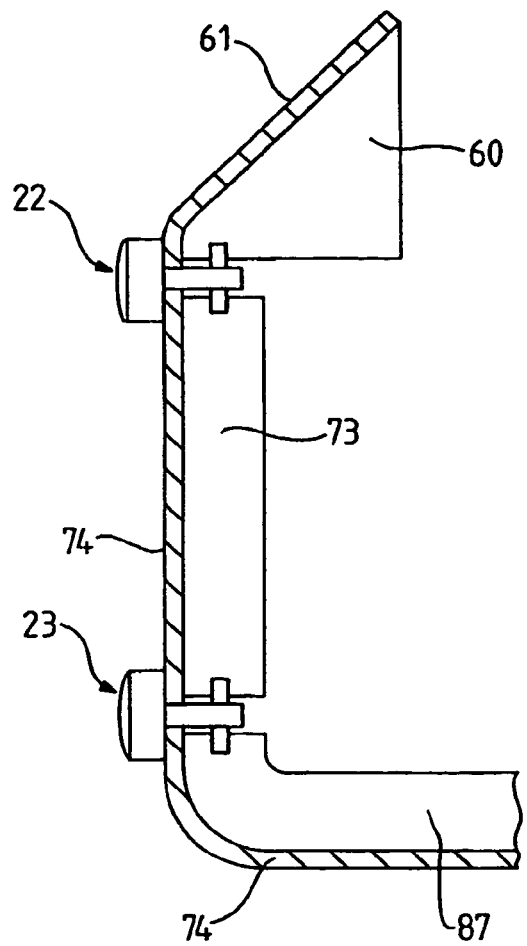
FIGS. 11a and 11b are sections showing other embodiments of the invention.
Figure 11B:
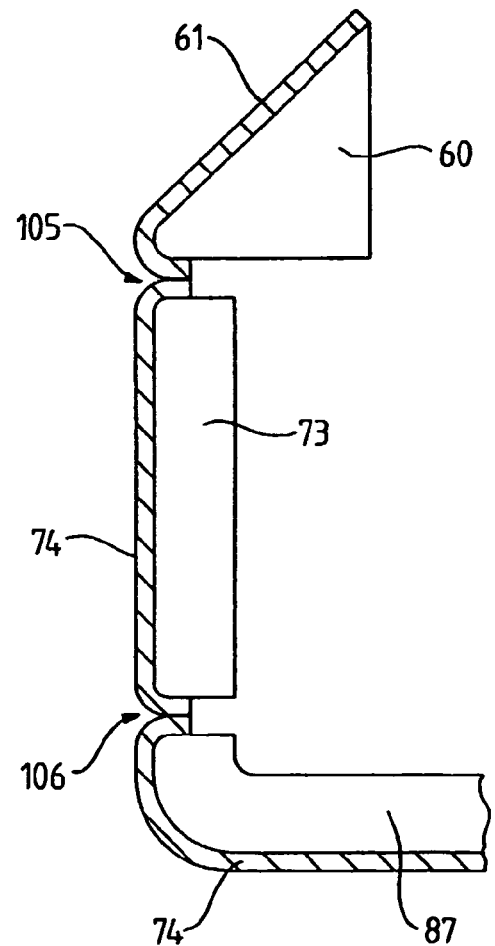

The communication device 1, includes the key array 6, a display 25, an antenna 26, an ear piece speaker 18, a polyphonic speaker 27, and a microphone 28. The communication device 1 is adapted for communication via a wireless telecommunication network, e.g. a wireless network. However, the communication device could also have been designed for a cordless network. FIG. 3 shows schematically and functionally elements of the communication device 1. The microphone 28 records the user's speech, and the analogue signals formed thereby are A/D converted by an A/D converter before the speech is encoded in an audio part 29. The encoded speech signal is transferred to processor 30. The processor 30 may support software in the phone. The processor 30 also forms the interface to peripheral units of the apparatus. These may include a Random Access Memory (RAM) 31 and a Flash Read Only Memory (ROM) 32, a SIM card 33, the display 25, and the key array 6, and perhaps a browser application 34, and a location module 35.

The browser application 34 can be used to request and receive information from the Internet. The location module 35 enables the terminal 1 to determine its current position.

The processor 30 communicates with a transceiver 36, e.g. a circuit, which is adapted to send and receive messages in a telecommunication network. The telecommunications network may be a GSM or W-CDMA network, but the invention may also be applied in connection with any other network, including but not limited to other kinds of wireless networks and various forms of cordless phone systems or in dual band phones accessing sets of these systems or networks. The audio part 29 speech-decodes the signal, which is transferred from the processor 30 to the earpiece 18 via a D/A converter.

The display 25 may form a permanent part of the casing or, to increase the potential for upgrading the engine throughout the life of the casing it may be a module that can be replaced to, for example, account for the inevitable improvements in graphics that may occur.

As discussed above, the front face 3 is optically permeable and acts as a light guide. The seamless light guide, passing light over the display region 4 as well as providing light to illuminate the key legends 15 reduces the number of lighting elements required to illuminate the device and provides a seamless transition from one area of the front of the device to another. By using this technique for delivering light and also allowing the light guide 14 to form the front surface of the device 1 as in the embodiment disclosed, the device is visually striking, there being no visible transition from the display region 4 to the input region 5 where the key array 6 is located.

The embodiment illustrated in FIG. 1 has a light permeable front face 3 that can be formed from sapphire or a similar precious stone. As soon as a mineral such as sapphire is used in place of other more flexible light permeable materials such as plastics, additional problems are introduced associated with the character of the material. In designing a durable device having, for example, a brittle material for a front piece 3 there are many difficulties. In one manifestation of the embodiment illustrated in FIGS. 1, 2 and 4 to 6, the light guide 14 is an optically seamless composite layer. As can be seen most clearly in FIG. 4, a plastics layer 37 that may be formed from Perspex or other transparent and/or translucent materials runs the entire length of the front face 3. There is a cut-out 38 for accommodating the ear piece speaker 18 that is optimised for use close to the ear. There is another cut-out accommodating a light pipe diffuser 39. This is located under the pillow 16 and extends across the width of the device 1. By placing the light pipe 39 under the pillow 16, a bright area on the front face is avoided and the light visible in the light guide will be diffused. LEDs 40, 41 are located at each side of the device at each end of the pipe 39. Light from the LEDs 40, 41 is channelled through the pipe 39 and diffused. The light pipe 39, in this embodiment is coated with reflective material so that light is channelled through the surface 42 that runs along the top of the LCD display 25. Embodiments without the coating provide some of the same advantages. The diffused light is accordingly channelled into and along the major axis of the light guide 14 to provide substantially uniform lighting for the LCD 25.

Figure 15:
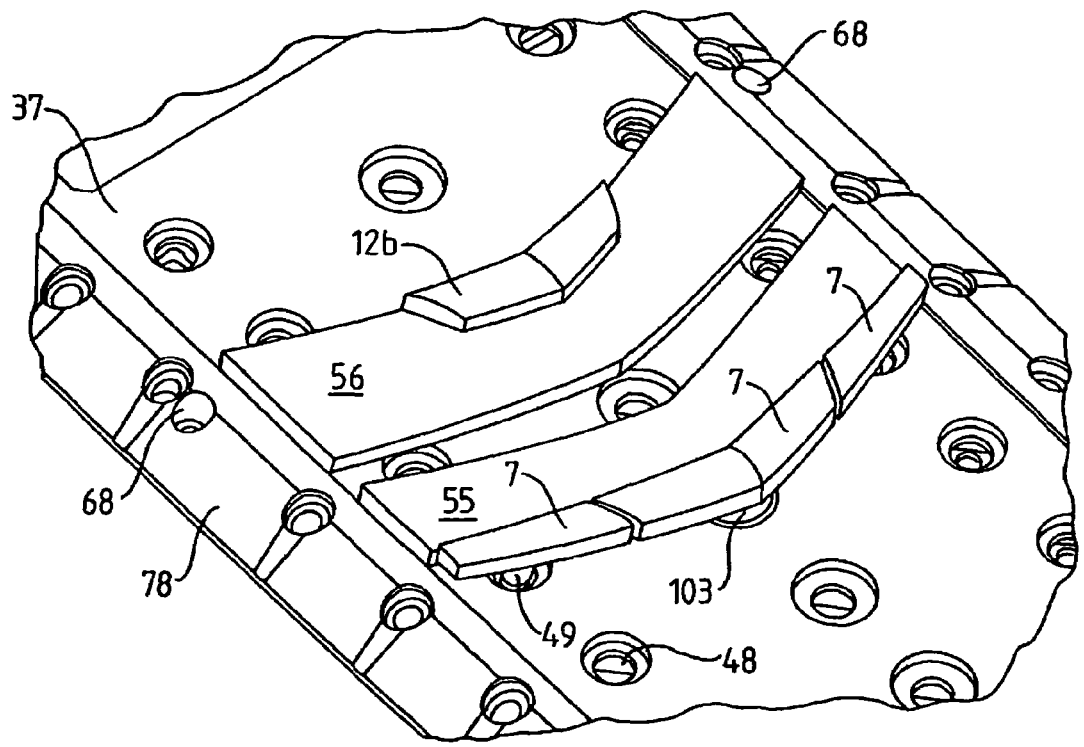
FIGS. 15 and 16 are perspective views of a partially constructed input region of the device.
Figure 16:
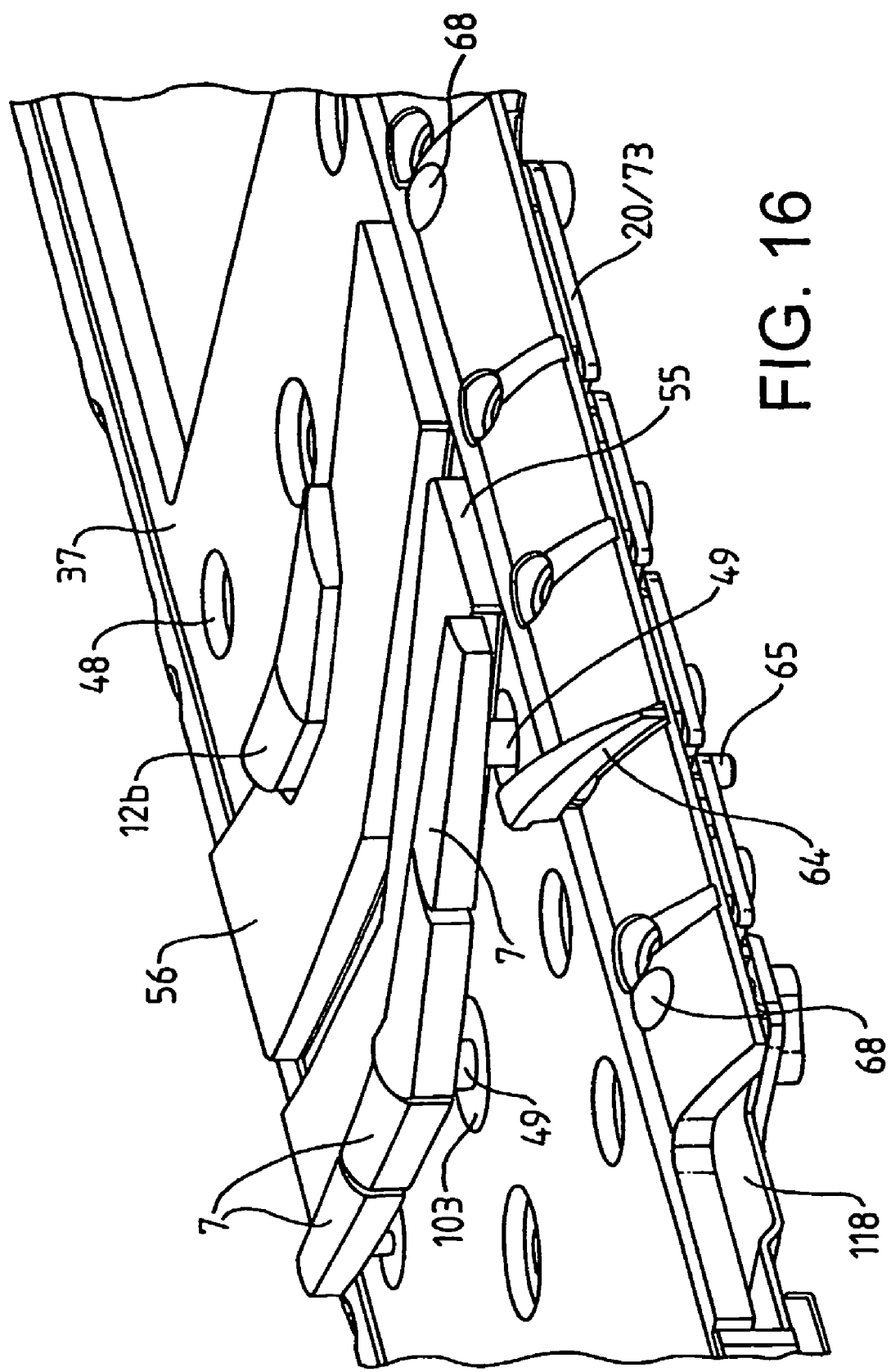

In this way light is pumped into the light guide 14 along the major axis from above the LCD 25. The light from the light pipe 39 illuminates the display region 4 and provides lighting for the input region 5. As illustrated in FIG. 15, additional LEDs 43 or other lighting elements are positioned along the edges of the Perspex layer or sheet 37 in the input region 5 to further illuminate the legends 15 for the keys of the array 6. The surface of extending portions 78 of the Perspex layer or sheet 37 is shaped to channel light from adjacent top firing LEDs 67 or the like towards the upper surface of the main portion of the layer or sheet 37. This assists in providing substantially uniform lighting for the input region. The additional LEDs 43 or the like are shielded from view by the bezel 19 to avoid light spots being visible and encouraging a uniform diffuse light across the light guide.

The LCD 25 itself is bonded to the rear surface of the Perspex sheet 37 with an energy absorbing adhesive sheet 45. Using this technique, and ensuring that there are no air gaps between the front of the LCD 25 and the Perspex sheet 37, provides a robust solution for mounting the LCD 25. The surface of the LCD 25 that is delicate and generally needs a protective layer distanced from it is protected by the Perspex layer 37 adhered to one of its faces. The drivers 44 for the LCD 25 can be seen in FIG. 5.

In the embodiment illustrated the Perspex layer 37 includes apertures 48 for locating individual keys and allowing the key shafts 49 to travel to make contact with a printed circuit board 50 located within the casing 2 to register user input. An independently inventive key layout, suitable for use with the general concept discussed, will be described in greater detail below. As the key layout is likely to be one of the most enduring elements of the design, it has been designed with future requirements for the casing in mind. The skilled man will be aware that modifications to the key arrangement can be made while still providing the flexibility to accommodate future engine requirements. For example, a joystick, or similar rotational device or multi-directional key could be utilised for input as could other input mechanisms traditionally used on laptop computers.

As can be seen most clearly from FIG. 4, the second layer of the composite light guide 51 is made in a number of sections 52-58. This is to allow for the choice of brittle materials to be used for the second layer 51. Sapphire has properties including its scratch resistance and optical clarity that make it suitable for use in this context although the material of this element is selectable a ceramic material could be utilised in this arrangement. Other suitable materials are glass and other minerals and precious and semi precious stones. When a transparent material such as sapphire is used, however, the light guide provides an external surface to the device. Arrangements for the second layer similar to those disclosed in concept in the illustrated embodiment are not necessary when the materials are not brittle. Alternative arrangements will, however, be apparent to the skilled man for accommodating brittle materials in this context.

As mentioned above sapphire is brittle. When considering how to introduce such a material into a casing 2 that is to be long lasting and durable, problems arise. This is particularly the case when the device 1 will inevitably be subjected to knocks and is likely to be dropped many times in its long existence. All brittle parts are bonded to a carrier formed from e.g. plastic or titanium in order to better absorb shock. In the embodiment described, the sapphire is formed in individual sections 52-58 for ease of manufacture. Each of the pieces is adhered to the Perspex layer 37 using a UV curing adhesive based on hybrid acrylic technology. In order to increase the durability of the composite light guide 14 and strengthen it against damage, the sections 52-58 are adhered to a more flexible Perspex layer 37 leaving gaps 59 extending across the entire width. These gaps 59 act as hinges to allow the composite layer 14 to be relatively flexible along its major axis. In the embodiment illustrated, the layout of the key array 6 has been designed with this in mind. The alpha numeric keys 7 are arranged in groups of three extending across the whole width of the second layer of the composite 51. The function keys or soft key 8, 9 are also arranged in two groups of three. The soft keys 8, 9 and the top scroll key 12*a* follows the line of the alpha numeric keys 7. The call handling keys 10, 11 and the bottom scroll key 12*b* which is displaced from the line of the others defines the lower edge of one of the elements 57 and the upper edge of another of the elements 56. This makes the second row of keys 10, 11, 12*b* distinctive whilst still avoiding problems in manufacture of the elements 52-58. The specific key array 6 illustrated has other properties and advantages that will be discussed later.

Although the embodiment described is designed with a brittle material such as sapphire in mind, the resultant arrangement could be formed from any number of other materials including plastics that provide the required optical characteristics. Similarly different key arrangements could be used without departing from individually inventive concepts that are disclosed.

When using a brittle material for a front face light guide 14 problems are also encountered when connecting the front face 3 to the rest of the casing elements. In the illustrated embodiment the edges of the brittle elements 52-58 are protected by the bezel 19 that sits around the whole of the face. The bezel 19, in this embodiment, is formed from a bezel support 60 overlaid with a 0.5 mm thick metal sheet, the bezel cover 61. The metal sheet 61 is bonded to the bezel support 60, that may be formed from plastic, with an adhesive such as a two part epoxy adhesive or a two part acrylic adhesive. As the metal sheet 61 is relatively thin this keeps the weight of the casing 2 down and also allows relatively precious metals such as titanium or gold to be used at relatively lower cost. The bezel 19 could, however, be a single part and/or be formed from a single material for example titanium.

The transparent face 3 in this particular embodiment is securely held in position by a robust mechanism. The Perspex layer 37 to which the elements 52-58 are bonded extends beyond the area covered by the elements to provide a lip or edge 62 around the whole of the composite light guide 14. This edge 62 is used to secure the front face 3 in position as it is tucked under the bezel 19 that defines the perimeter of the front face and squeezed between the bezel 19 and the side frame 20.

As can be seen in FIG. 1, the bezel 19 is punctuated with front face protectors 63 whose function will be described in more detail later. These front face protectors 63, in this particular embodiment play a role in holding the casing elements together.

The front face protectors 63 have a tip part 64 that extends over the bezel 19 and a shaft 65 that passes through the bezel 19 and into the plastic side frame 20. The shaft 65 may be tightened onto the frame 20 using a nut 95. In this case the nut stops the front face protectors from falling out of the device. In one embodiment the shafts 65 are screwed into the tips 64 at one end and into the side frame element 20 at the other although other manners of connection could be employed. The shaft 65 and tip 64 could also be one piece rather than two. The bezel 19 and the Perspex layer 37 of the transparent face 2 are captured by the front face protector 63 and side frame element 20 as can be seen in FIG. 9*b*. The front face protectors 63 accordingly grip the transparent face 3 securely between the side frame 20 and the bezel 19. The front face protectors 63 are only located next to the key array 6. In order to secure the transparent face 3 around its perimeter additional screws 66 are added to draw the bezel 19 towards the side frame 20 and squeeze the transparent face 3 in place. In one embodiment, the screws 66 thread through the side frame 20 and tap into the bezel support 60. Once the bezel support 60 is secured to the side frame 20 the outer shell 61 of the bezel 19 can be adhered to the support 60 to hide the tapped screw ends 66. Alternatively the bezel is stuck to the support first (a sub-assembly) and this sub-assembly is then screwed to the frame.

As can be seen in the figures, although the more flexible transparent substrate 37 is overlaid by the bezel 19 secured in position by the front face protectors 63 and other connectors, the sapphire is maintained spaced from the bezel 19 so that it is protected from chipping or other damage as a result of contact. The edges of the sapphire elements do not protrude above the edge of the bezel 19 to provide further protection for the more vulnerable edges. In the arrangement described, the transparent face 3 is gripped in position between the bezel 19 and the side frame 20. The more flexible substrate 37 could, however receive screws or other fasteners to located it relative to the other frame members without damaging the more brittle sapphire layer. The choice of material for the bezel is one open to selection. Precious metals including gold, platinum, silver, steel amongst others would be suitable. The same applies to the material of the front face protectors. Both these elements and others that the skilled man will realise are suitable could be encrusted with precious or semi precious stones such as sapphires, rubies, emeralds and diamonds amongst others. Other crystals or minerals or other materials and veneers could also be utilised.

To reduce the ingress of dirt or fluids a sealant 69 is located between the bezel 19 and the transparent face 3. One way in which this can be introduced 25 is to paint a seal on the underside of the bezel 19 which when dry is compressed between the transparent light guide 14 and the bezel 19 when the bezel 19 and the side frame 20 are pulled together.

As can be seen in FIG. 6 or 9, a first rail 22 is located in the interface 30 between the side frame element 20 and the front face 3. The rail 22 hides the discontinuity between the parts from sight and protects vulnerable edges to enhance the durability of the device 1. The rail 22 may be a stamped metal piece 'T' shaped in section extending around the perimeter of the side frame 20. The stem of the 'T' 68 is trapped between the side frame member 20 and the bezel 19 as these two pieces are drawn together on assembly. The stem of the T has apertures 70 that sit over corresponding projections 71 on the side frame 20 member to prevent it from being withdrawn from between the two parts when in position. The top of the T acts as a carrier plate to which an additional extruded piece 72 is soldered or otherwise adhered to provide a seamless finish. The stem could instead be formed from a plastics material.

The side frame member 20 in this particular embodiment is a plastic support 73 with an exterior cover 74. The cover 74 may again be a metal sheet formed, for example, from a precious metal or perhaps a wood veneer or another layer such as leather or other skin. The bonding agent most suitable for adhering the layer to the plastic frame member 73 will differ depending upon the materials that need to be adhered. For metal to plastic a suitable adhesive is a 2 part epoxy resin or 2 part acrylic adhesive. For metal to metal the adhesive would be a reactive polyurethane film or a two part epoxy resin. Similarly the back cover 21 in this embodiment may have a plastic frame and be covered with for example a leather, wood or perhaps metal veneer. With the flexible veneer materials such as leather, it is preferable for the material to be taut on the frame. This is achieved during the veneering process using conventional techniques.

The transparent face 3 provides a seamless transition between the display 4 and the input regions 5. In the display region 4, the LCD 25 is located behind the transparent face 3 and in the input region 5 the key mechanism 75 lies behind it. In one embodiment described, the key mechanism 75 can be seen through the front face 3. However, in other embodiments the inner surface 76 of the Perspex substrate 37 may be coated with an opaque material to prevent the inside of the device being seen. Alternative methods of obscuring the inner workings of the device from view such as introducing additional opaque layers or obscuring the view in other ways will be apparent to the skilled man.

For embodiments where, for example, the key operating mechanism 75 can be viewed through the front face 3, it may be desirable to obscure the PCB 50 from view.

The constructed casing 2 provides a housing for the printed circuit board 50 holding the engine components 24, and a battery 79. When the device 1 is a radio telephone, a SIM card holder 80 is provided to accommodate a SIM card 81. For operation under some radio protocols this will clearly not be necessary.

Returning briefly to the front of the device, located above the display region 4 is the pillow 16 so named because it designed for the user to rest his or her ear against when making a telephone call. The pillow 16 overlays the ear piece 18 of the device. As described previously there is a cut-out in the Perspex substrate 37 of the light guide 14 to accommodate the ear piece 18, the pillow 16, in the illustrated embodiment is adhered to the Perspex substrate 37 covering the ear piece 18. The pillow 16 provides suitable apertures 17 to channel sound to the user. The characteristics of pillow 16 both in terms of the material and surface decoration may be selectable by a commissioning party.

The Perspex and sapphire light guide 14 is relatively cold to the touch, the material of the pillow 16 can be chosen to be a material that is inherently warmer to the touch and less prone to marking than a transparent shiny 25 surface. Materials that are thought to be particularly suitable are ceramics or wood and leather veneers. The shape of the pillow 16 obscures part of the LCD 25, providing opposing triangular sections 82, 83 that are used to indicate battery capacity and signal strength respectively.

To complete the structure, the casing 2 has a rear cover 21 and internal compartments 84, 85 suitable for retaining the engine 24 the battery 79 and in this embodiment a SIM card 81. The device illustrated, in common with many other radio telephones, advantageously allows access to the battery compartment 85 as the battery 79 may periodically need replacement. In order for the engine 24 to be protected during this activity, the battery 79 is retained in a compartment providing connectors to the engine 24. Along side the battery compartment 85 in this embodiment is the SIM card holder 80. Under protocols where a SIM card 81 is used to hold subscription information, the user may wish to remove the SIM card 81. For this reason it is convenient for the back cover 21 to be removable to expose both the battery 79 and the SIM card 81. The battery compartment 85 and SIM card holder 80 are provided by an internal casing element 87 that is secured to the side frame 20. This may be formed from plastic or one of many other suitable materials. In one embodiment the compartments are formed from stamped metal sheet which may be stainless steel.

The battery contacts 90 protrude into the battery cavity 85 to provide a simple way of connecting the battery 79 to the engine 24. The battery connection will typically have a power connector 91, a ground 92 and two signal connectors 93, 94.

In the embodiment illustrated, the power 91*a,b,c* and ground 92*a,b,c* connectors are divided into three. This reduces the resistance between the battery 79 and the engine 24 as the leads are in parallel, it also reduces the chance of power being lost to the engine 24 as a result of a harmonic resonance frequency of the connector being reached as at all times there is likely to be at least part of each three part connector completing the circuit between the engine 24 and the battery 79.

The casing 2 is completed by assembling the back cover 21 to the side frame 20. In the illustrated embodiment, the back cover 21 is formed from three pieces 96, 97, 98. A first piece 96 overlays the antenna location. In this embodiment it provides an aperture 99 in which the polyphonic speaker 27 is located to provide for polyphonic sound. This additional speaker 27 has not been optimised for use in close proximity to the ear as has the speaker 18 located beneath the pillow 16. This allows it to be more effective as a handsfree speaker and enables a greater range of ring tones to be utilised. As the first piece 96 also covers the antenna its dielectric constant is relevant.

In a device of this type where the casing 2 is to survive generations of engines 24, the materials from which is formed are important. They should be hard wearing and durable, retaining their attributes for years longer than is currently required. For this reason ceramics have been considered as an option for the back cover 21 for some embodiments of the invention. Other materials already discussed such as metals or precious metals or veneers would also be possible. With ceramics, however, despite having many desirable characteristics, for locations near an antenna relevant for devices containing such an element, the dielectric constant of the material interferes with the desired transmission pattern.

To provide many of their desirable characteristics without the dielectric constant becoming too high, the rear cover piece 96 can be formed from a material with a lower dielectric constant with a suitable depth of layer deposited on it. This technique and suggested materials could be used for other elements of the casing.

The rear casing element 96 covering the antenna is again screwed to the side frame element 20 and in the process captures the second rail 23 similar in construction to the first rail 22 between the side frame 20 and the back cover 21. Again the rail 23 is provided with apertures 70 that are positioned over corresponding projections 71 on the side frame 20 to more securely hold the rail 23 in position when the back cover 21 is attached.

A second rear casing element 97 covers the battery compartment 85 and the SIM card holder 80. This element is releasably secured to the other casing elements using screws 99 to allow relatively easy access to the SIM card 81 and battery 79. In a preferred embodiment a quarter turn of a screw 100 releases the cover element 97 to allow it to be removed. The same action can disconnect the battery 79 to allow the SIM card 81 to be removed.

The second rear casing element 97 is attached to the side frame 20 in a similar manner to that described in relation to the first rear casing element.

The third element of the rear casing 98 covers the handsfree speaker 27. This may be only relatively thin and formed from a precious material such as gold. It will be provided with a suitable aperture 102 to channel sound from the polyphonic speaker 27 that may be used in hands free mode and for providing an audible ring tone.

In the embodiment described the front 3 and rear casing elements 96, 97, 98 are secured to the side frame 20. A silicon sealant 69 or similar, may be extruded around the inside of the back cover 21 to prevent unwanted ingress of dirt and fluid.

The skilled man will realise that the number of parts and the manner in which they are connected can be changed without departing from the several inventive concepts described. For example, in other embodiments the casing may be held together using other techniques and in other ways.

As well as obscuring exposed edges, the rails 22, 23 provide additional elements for customisation as they can be formed from a variety of different materials, in particular different types of precious metal for example gold or platinum as discussed previously in relation to the bezel. The material for the entire 'T' shaped piece or the extruded element could be a precious metal. They also act to protect vulnerable edges of veneered frames from exposure to potentially damaging forces. In doing this unsightly edges are obscured from view. This provides quality and durability in keeping with the overall concept of a retainable casing for a communications device. Regardless of the material of the veneer, this is a convenient arrangement for securing all the elements in place for a durable finish.

In an alternative embodiment illustrated in FIG. 4b, instead of providing rails 22, 23 to protect exposed edges, the adjacent edges themselves are turned inward 105, 106 and held in close proximity. This arrangement also provides the advantage of protection and keeps unsightly discontinuities from view.

Figure 12:
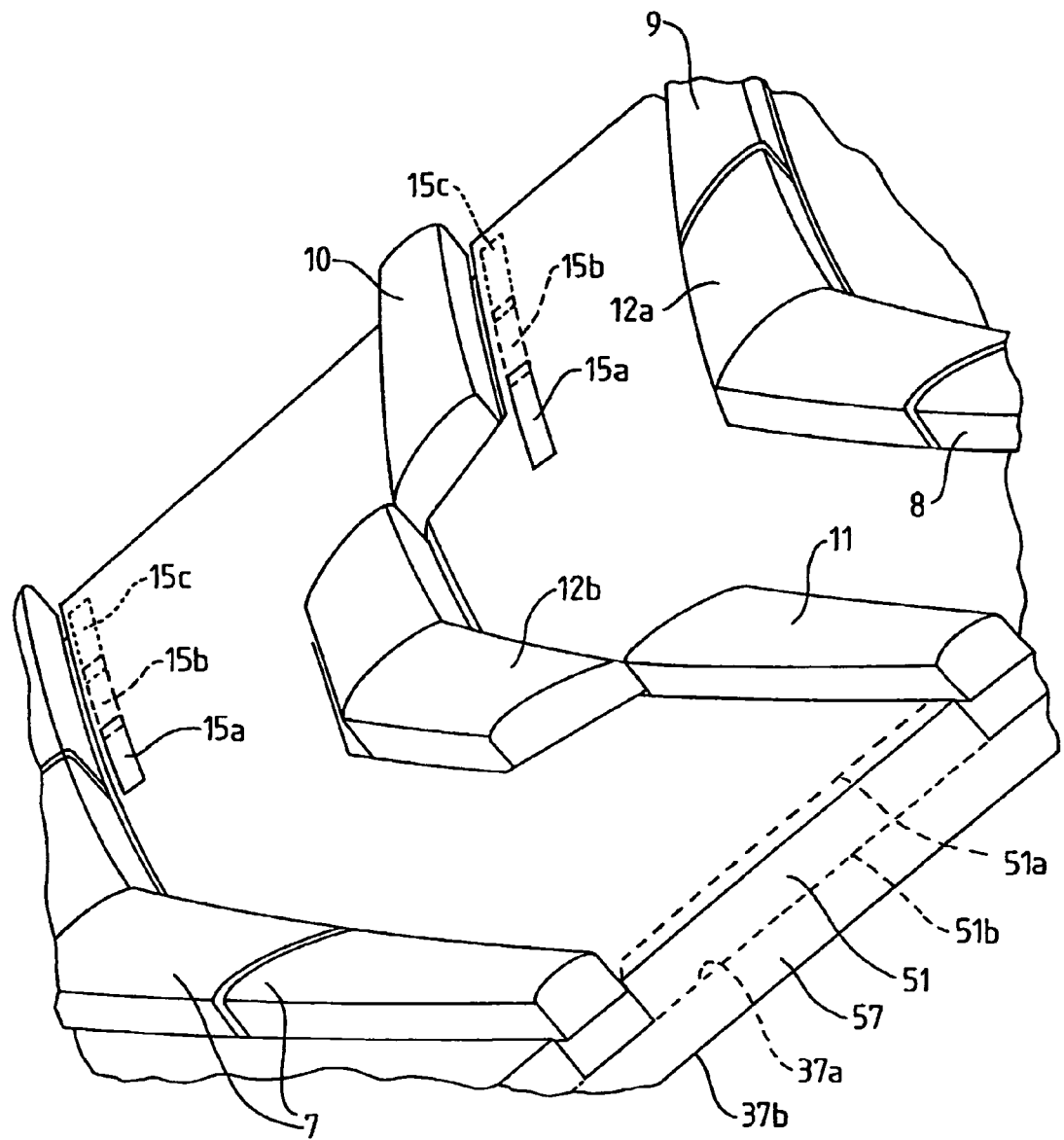
FIG. 12 is a perspective view of part of the input region of the device illustrating the location of legends associated with keys.
Figure 13:
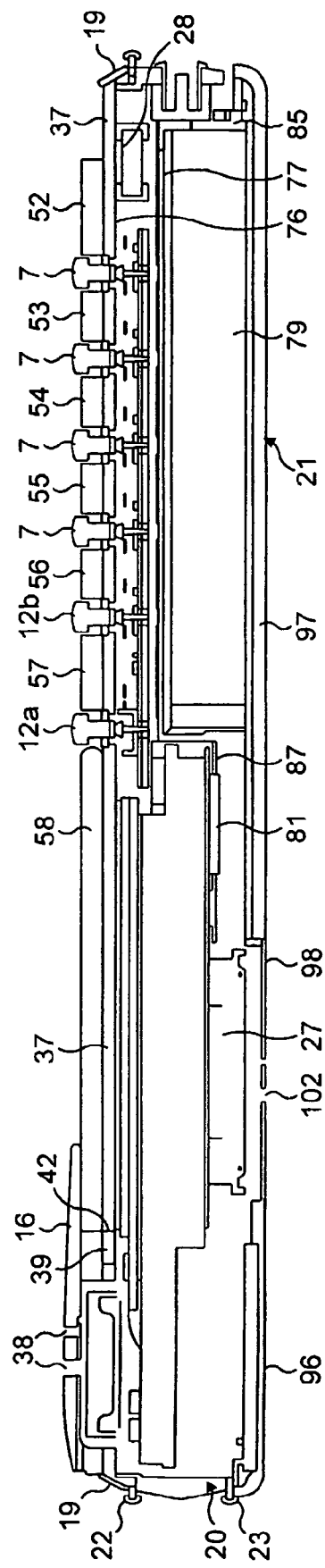
FIG. 13 a longitudinal section through the communication device.
Figure 14:
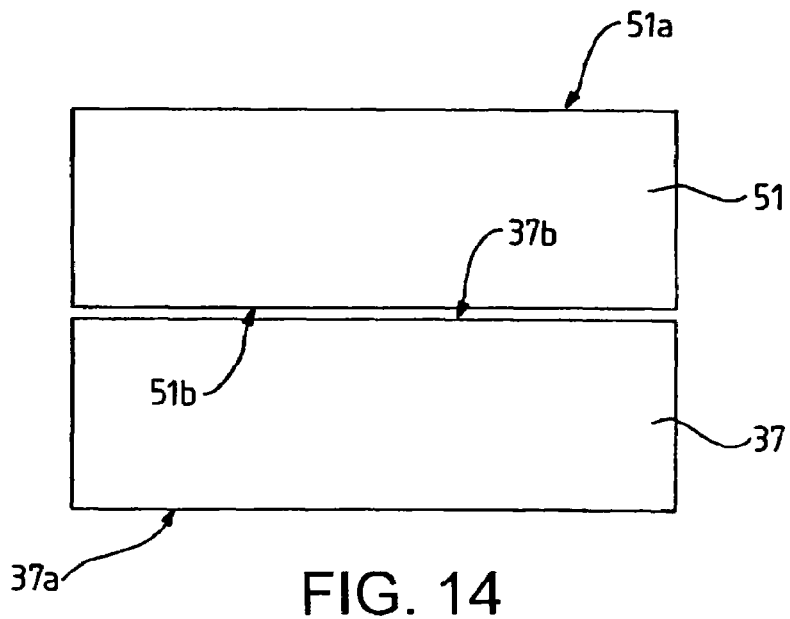
FIG. 14 is a schematic section through the light guide illustrating the surfaces available for carrying the legends.

A casing with an optically permeable front face provides new opportunities. In a particular embodiment, described with reference to FIGS. 12 and 14 legends 15 associated with the keys of the key array 6 are located on both the front 37a and rear 37b surfaces of the Perspex layer 37. With communications devices becoming ever more sophisticated, it is common for each key provided to have a number of different functions. It is useful to be able to label visually the different possible functions associated with a key. For the alpha numeric keys 7 in particular, each key is associated with a single digit and a group of letters or symbols. Ideally these should be displayed clearly.

Historically the keys have held the associated legends. As devices have become smaller this has, however, becomes more difficult, it being an especial problem to distinguish between the different legends for respective modes of operation as the letters and numbers are so small. In the illustrated embodiment, the legends 15 for associated keys are located on respective surfaces of the light guide 14 which, as the device is tilted, move together or apart depending upon the angle from which they are viewed. This provides a visual distinction between the legends 15 on the different surfaces which can be used to distinguish between the modes of operation. As the front face is optically permeable, the legends appear to float in or above the device. By spacing the legends along an axis perpendicular to the third dimension, the thickness of the front face, the front face is given some prominence, thus an additional dimension has been added to the normally opaque front face.

In the embodiment illustrated the legends 15 are located on the outermost and innermost surfaces of the Perspex layer 37a, 37b. The legends 15 appear to be floating in the light permeable layer. The manner in which the legend 15 is located on the layer is a matter of choice for the skilled man. One method is to print the legend on to the surface using an etched plate filled with ink. Another way may be by using PVD (Physical Vapour Deposition) techniques to deposit the 'printing' directly onto the Perspex layer. Other techniques for fixing legends could be used including attaching labels.

In the embodiment discussed the legends 15a 15b are located on opposing surfaces of the Perspex layer 37a 37b. This enables a single element, the Perspex layer 37, to be printed instead of each of the sapphire or other pieces 52-58. Problems encountered with ink wearing off when printing techniques are used are also avoided by protecting the surfaces containing the printing with the second layer. In other embodiments and to increase the depth of spacing of the legends and hence the separations possible when viewed at different angles it may be desirable to place the legends on the innermost 37a and outermost surfaces 51a of the composite. In order to fix the legend 15 printed on the outer surface 51a where it may encounter wear, a coating or other protective layer may be provided over the surface. This may not be necessary if PVD techniques are used to produce the legend 15 as such techniques produce a bond between the deposited layer and the substrate that is more hard wearing. In still other embodiments the legend 15 could be provided on the underside 51b of the sapphire elements and on the innermost layer of the Perspex substrate 37b. Again by avoiding the external surfaces of the transparent layer the problem of wear of the legends 15 is largely avoided. The outermost legend is protected by the top layer 51 of the composite light guide 14 and the innermost legend 15 is not accessible.

In sandwiching the legends between two optically permeable layers 37, 51 which of the two sandwiching layers carries the legend is largely immaterial. The properties of the respective materials, if indeed they are different, and other factors can be taken into account in deciding which layer 37b, 51b actually carries the legend. With a composite optically permeable substrate, the more layers that are provided, the more visually distinguishable legends can be accommodated. For example with two composite layers there are three available planes for legends, with three layers, four planes and so on. If all the legends were placed adjacent a single key, the visual distinction may cause difficulty with large numbers of layers being used to distinguish functionalities. Other embodiments could use the different planes for legends at different locations on the device so that one set of keys has a legend in a first plane, a second set of keys in a second plane and so on.

To accentuate the illusion of the legends floating, or to increase the distinction between the two layers, the thickness of the optically permeable layer between the respective layers carrying the legends can be increased. In the same way these features can be reduced by decreasing the thickness between the planes carrying the legends.

The ink or paint can be chosen by the skilled man to provide a number of effects. The ink may, for example, be required to pearlesce or fluoresce, or be black, white, or one or more of a wide range of colours. As the legend is located on a light guide, fluorescent and pearlescent materials enhance the visibility of the legends. The type script, colour or other character of the legend or element carrying the legend may be selected by a commissioning party.

Instead of techniques that add ink or other visible materials to the surface merely etching the layers may be sufficient to make the legends visible if the illumination is adequate.

Embodiments illustrating the location of legends associated with keys in a light permeable face has been described with reference to the illustrated embodiments in the context of other independently inventive features claimed in copending applications. The skilled man will realise that many alterations to the specific features disclosed can be made without departing from the scope of the invention.

The skilled man will be aware that the character described above in relation to specific elements of the device can be mixed and matched to suit many distinct design options.

The input region of the device will now be described in more detail, primarily with regard to FIGS. 9 and 15 to 21

The input region 5 comprises a key array 6, as described above. In this embodiment, the key array is made up of a plurality of individual keys 7-13.

Each of these individual keys comprises a key tip 64 and shaft 49 extending from substantially the centre of the key tip 64, together with an upper bearing 103, O ring 107, circlet 108, spring plate 110 and lower bearing 109 positioned respectively along the shaft 49*a* from the key tip 64. The spring plate 110 is supported by a spring plate support 114 provided on the PCB 118. The spring plate comprises a main body, and a tongue 111 formed from a single piece of sheet metal. The tongue has been formed by stamping an inner portion of the sheet, so that two sides and an end of the tongue are free from the remaining main body of the sheet. The spring plate also has a portion or portions stamped out to provide an aperture for the key shaft 49 and spring plate support 114. One end 113 of the spring plate comprises contacts for contacting respective contact regions on the PCB. As will be appreciated by a person skilled in the art, a single contact could be used for this purpose, but the provision of two contacts provides greater reliability. The spring plate support 114 comprises three members upstanding from the PCB 118. These members may form part of a unitary structure, or may be separate elements. The first member comprises a recess 115 dimensioned to receive one end 112 of the spring plate 110 and hold that end 112 in position. The second member of the support 114 comprises a lip 116 extending towards the first member. This lip 116 is provided to restrict the upward movement of the other end 113 of the spring plate 110. The third member of the support 114 comprises a recess 117 for receiving the end of the tongue. This third member is positioned relative to the second member, such that the tongue of the spring plate 110 has to be flexed in order for the end of the tongue to correspond with its recess 117. Optionally, the spring plate support may comprise a fourth member comprising a lip extending towards the second member. In this case, the PCB contact regions are extended to the surface of this lip, so as to bring them closer to the spring plate contacts. Alternatively the contact region bearing lip may be formed as part of the second member itself, or eliminated altogether.

As mentioned above, in the present embodiment, the individual keys are grouped in threes, their tips extending across the whole width of the second layer of the composite 51. This facilitates manufacture of the brittle elements 52 to 58. The tips of the alphanumeric keys 7, soft keys 8, 9 and top scroll key 12*a* are in alignment with those of the other keys in their group. In the remaining group of keys, however, the tip of the bottom scroll key 12*b* is displaced from the line of the tips of the other two keys in its group, namely the call handling keys 10, 11. In any event, in each group the edges of adjacent key tips complement each other, and are closely spaced. This eliminates the need for the composite 51, or other filler material, to extend between the key tips. It also has the advantage of simplifying the overall appearance of the input region of the device to the user. Further properties and advantages of the specific key array 6 will be discussed below.

Figure 17:
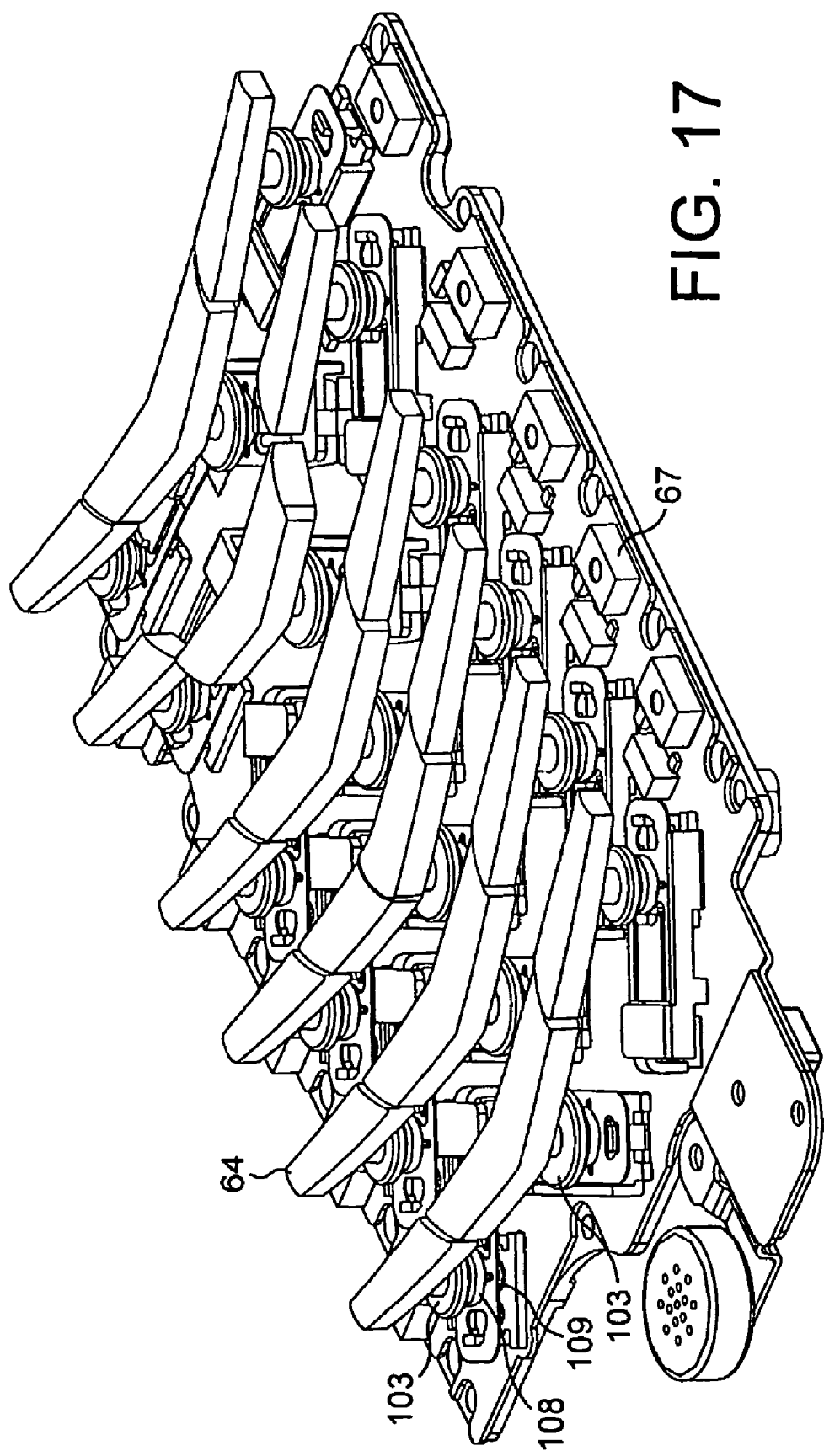
FIG. 17 is a perspective view of keys of the device including their actuation mechanisms.
Figure 18:
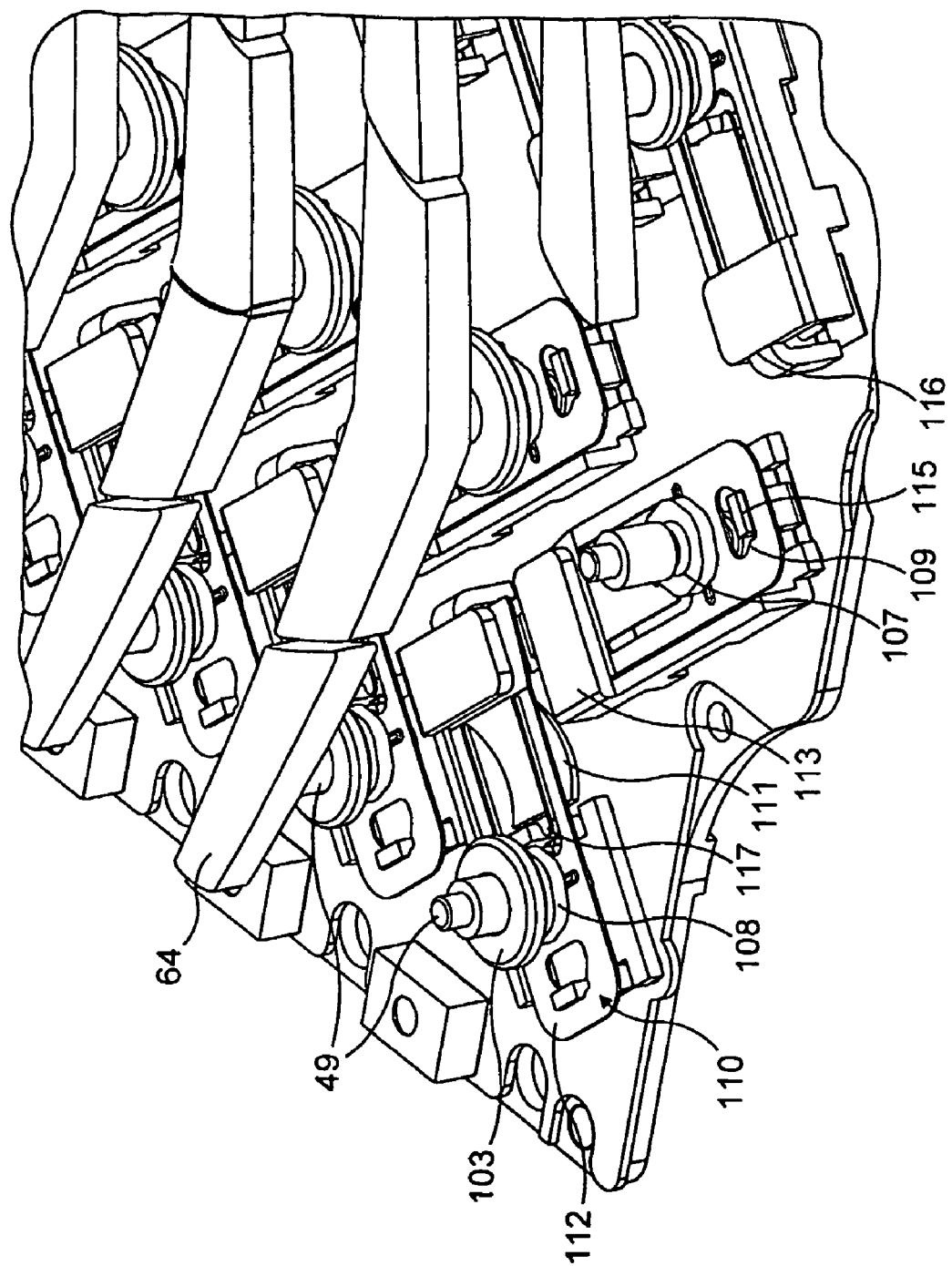
FIG. 18 illustrates some of the keys illustrated in FIG. 17, with the key tips removed.
Figure 19A:
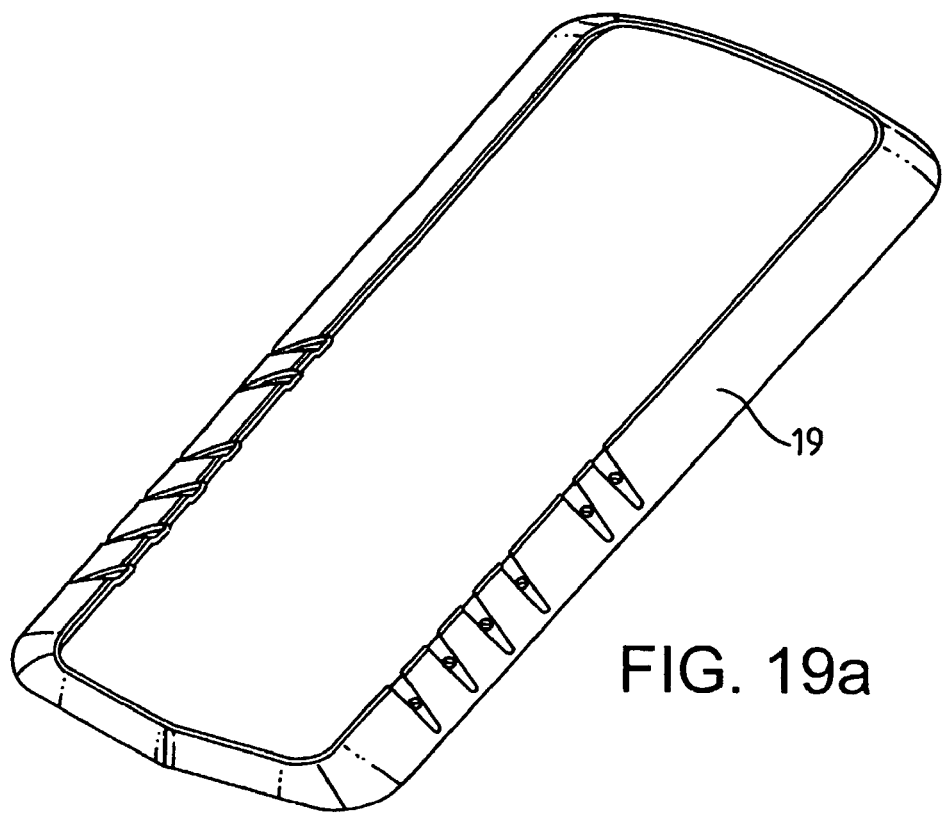
FIGS. 19a and 19b are front and rear perspective views of the outer shell of a bezel respectively.
Figure 19B:
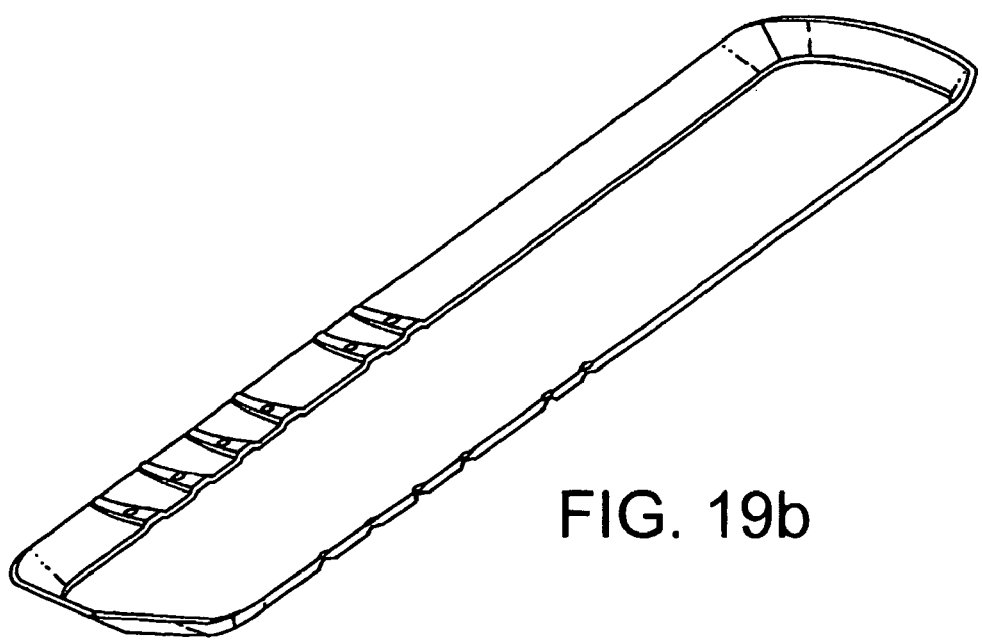

As can be seen in particular from FIGS. 17 and 18, the spring plates 110 and supports 114 of adjacent alphanumeric keys 7 are positioned perpendicular to each other. This provides a geometrically simple solution to the problem that the spring plates cannot be positioned in alignment with the keys themselves. One cause of this problem in the embodiment illustrated is that the spring plate of each outer key is longer than the average length of its corresponding key tip, and this extra length cannot be accommodated elsewhere. This is primarily because the spring plate of each central key is only minimally smaller than the average length of the corresponding key tip, and the keys are closely abutted (there is only a gap of about 0.245 between the keys) so that there is insufficient space to allow for the extra length. Furthermore, whilst the key shaft 49 of each key is substantially central to the key tip 64, the key shaft aperture of the spring plate 110 is off-centre. This exacerbates the problem for the outer keys, and even results in the spring plate of each centre key not being able to be accommodated in the space under its corresponding key tip.

The keys may be constructed, and the input region of the device assembled 30 as follows. Upper bearings are inserted into the apertures 48 of the Perspex layer of the device. Ruby bearings are preferably selected for this purpose, for three main reasons. Firstly, ruby is very hard wearing, and will thus be able to handle multiple operations of the keys over a substantial period of time. Secondly, the upper bearings of this device are larger in diameter than the corresponding widths of the key tips, which means that they will be visible in situations in which the front face of the device is transparent (e.g. second layer 51 may be sapphire). Hence, advantage may be taken of the fact that a ruby is an attractive jewel, which the user will be pleased to see. Thirdly, the use of a hard material such as ruby will provide greater accuracy of fit of the key in the device, as opposed to using a resilient material, such as PFTE.

Lower bearings 109 are provided in a titanium plate which is fixed to the rear of the PCB 118. The inner and outer diameter of the lower bearings 109 are smaller than the upper bearings 103, but their centres are aligned. They are also preferably made of different material—the material of the lower bearings having shock absorbing qualities such as PFTE.

The key shafts 49 are machined, to have a first portion 49*a* of appropriate thickness to pass through the inner diameter of the upper bearings 103 and a second reduced diameter portion 49 to pass through the inner diameter of the lower bearings 109. Shaft 49 and circlet 108 may be machined from a single piece of metal, or the circlet 108 may be subsequently attached to the shaft 49. They are preferably formed of stainless steel. Further, an O ring 107 is provided adjacent the circlet 108, on the thicker diameter portion 49*a* of the shaft 49, to provide a water seal. Both the circlet 108 and the O ring have an outer diameter smaller than that of the upper bearing, so that they are not visible to the user when in situ. However, the circlet has an outer diameter sufficiently larger than the inner diameter of the upper bearing, so as to prevent the key from falling out of the device.

The key tips are crafted into the desired shape from a desired material, which may be a metal such as gold, platinum, silver, or stainless steel. They may also bear precious stones. For example a key tip or tips may be diamond encrusted, or have a precious stone set in it. Once a key shaft has been passed through an upper bearing, a key tip is joined to it. This may be achieved using conventional braising techniques.

The spring plate supports 114 are provided on the PCB 118. Each spring plate support 114 is preferably of unitary structure, manufactured from lightweight metal such as aluminium. The supports may then be soldered onto the PCB using conventional techniques. The spring plate supports 114 are positioned to hold the spring plates 110 so that the centres of their shaft apertures align with those of the lower bearings 109. Contact regions for the spring plate contacts are provided on the PCB (or the lip of the second or fourth member of the support as described above).

The spring plates 110 themselves are provided by stamping sheet metal, such as beryllium cooper with gold flash or the like. The plates 110 are affixed to the supportsl 14 by positioning one end 113 of the spring plate under the lip 116 of the second member of the support 114, fitting the other end 112 of the spring plate in the recess 115 of the first member of the support 114, flexing the tongue so that its end corresponds to the recess 117 of the third member of the support 114, and positioning the end of the tongue in that recess. When in position, the free end 113 of the spring plate 110 is naturally biased upwards toward the restraining lip 116.

The dimensions of various components of the keys and their relative positions are important in smooth key operation. The distance between the upper and lower bearings has been maximised by placing them either side of the spring plate switching mechanism and passing the shaft through the spring plate. In such a position, the bearings hold the key straight when it is operated, thereby avoiding contact with neighbouring key tips or the need to place keys further apart to prevent such contact. This, in turn, results in good switching functionality and feel.

Also, the dimensions of the keys are such that the lower surface of each key tip 64 contacts the surface of the Perspex layer 37 before excess pressure can be applied to the spring plate 110. In the present embodiment, the circlet 108 is positioned along the shaft such that it gently rests on the spring plate when the keys are in their normal non-depressed state. Also, the thicker portion of the shaft is of an appropriate length that, when in the normal state, there is a gap between the lower surface of the key tips and the surface of the Perspex layer 37 which is the same as, or only slightly greater than the distance the circlet 108 has to travel to cause the spring plate contacts to contact the contact regions.

This overcomes a potential problem of pressure being applied to the spring plate if the switch itself provides the end stop for the motion.

The dimensions of the keys are also important for the external appearance of the device. Preferably, the key tips are of a thickness that they protrude from the surface of the second layer 51 of the composite, at least when the keys are in the aforementioned normal state. When the composite is substantially transparent, this will give the impression of floating keys, and add to the three dimensional effect mentioned earlier concerning the key legends 15. Furthermore, the key tips should be sufficiently deep to be partially sunk into the second layer of the composite, and preferably have at least two opposing substantially flat sides which correspond with sides of the second layer to prevent lateral rotation of the keys. A gap of the order of 0.1 mm is achieved in the present device between the keys and second layer of the composite: a gap insignificant to the human eye and suitable for assisting in the prevention of lateral rotation of the keys. Lateral rotation is further hindered in the present embodiment, by virtue of the provision of mirrored slanting of the sides of adjacent keys.

In order to ensure the correct relative spacings of elements of the key, the Perspex layer 37, PCB 118, and titanium plate 77 are clamped together. In this embodiment, the clamping is provided by the front face protectors 63, and by the provision of additional tapped bosses in projections 68 of the Perspex plate and associated fixing means. Consequently, once the keys have been positioned, the Perspex layer, PCB and titanium plate can be clamped together using the bosses and fixing means, thereby holding the keys in place and forming a manageable module. This module may then be readily installed in the device using the front face protectors as described above with reference to FIG. 9B.

Operation of the keys of the device will now be described. As the user applies pressure to a key tip, the shaft moves downwards, travelling through the bearings and shaft aperture of the spring plate. This results in the circlet applying pressure to the part of the main body of the spring plate which defines the shaft aperture. Continued pressure on the key tip will then cause the circlet to apply an increasing force to this part of the spring plate, causing the main body to deform around the circlet. Eventually, this deformation will cause the tongue to overcentre, resulting in the free end 113 of the spring plate 110 flicking from its naturally biased position (upwards towards the restraining lip 116) to a second position, in which the spring plate contacts contact the contact regions on the PCB. An electrical signal is consequently sent to the processor indicative of actuation of that key. This arrangement gives a distinct click providing a clear quality indication to the user that the key has been actuated. As the user removes pressure from the key tip, the circlet, in turn, removes pressure from the spring plate 110. The tongue promptly returns to its normal position, and the free end of the spring plate flicks up to its naturally biased position, breaking the contact.

Figure 20A:
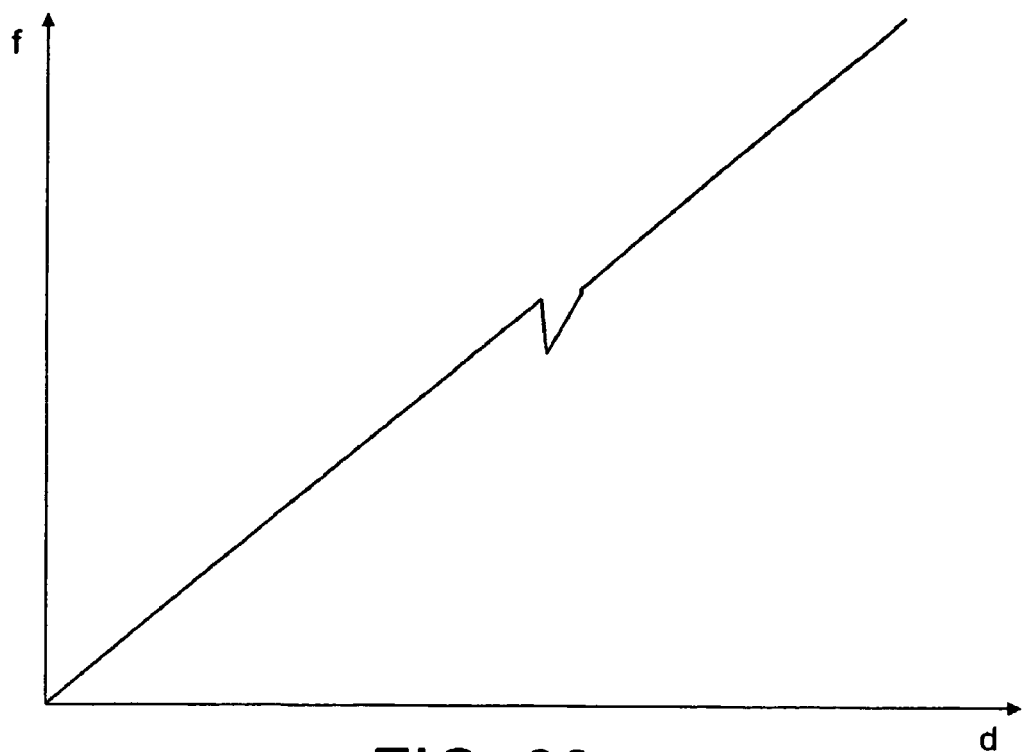
FIGS. 20a and 20b are a graph showing force against distance for a key such as that illustrated in FIGS. 17 and 18, and a conventional key using a dome respectively.
Figure 20B:
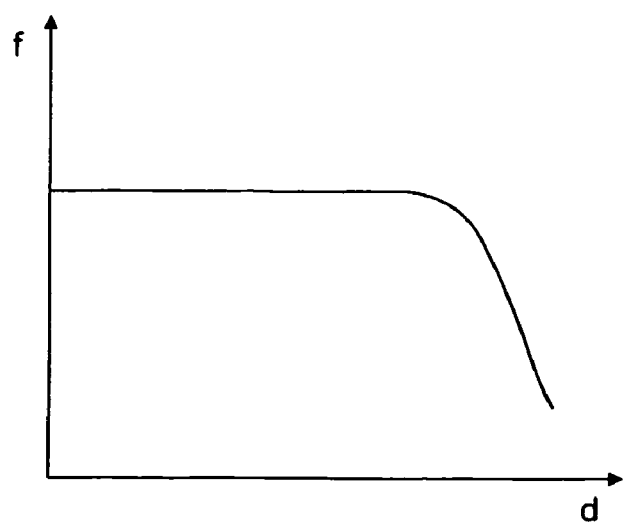
Figure 21:
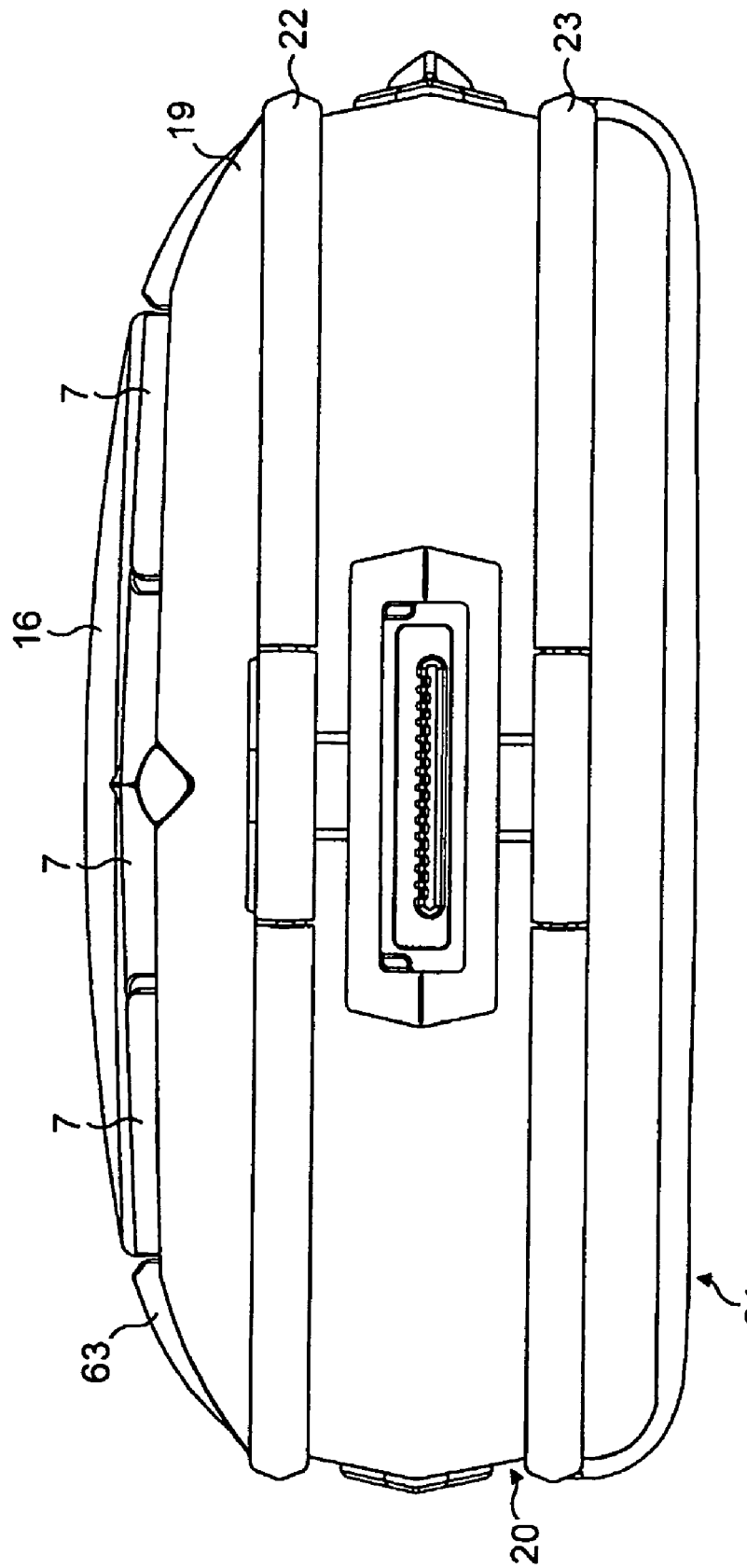
FIG. 21 is a bottom plan view of the device of FIG. 1 (with the chin face protector omitted).

FIG. 20a is a graph illustrating the force against distance profile for a key such as that illustrated in FIGS. 17 and 18. This profile improves the tactility of the key over, for example, a typical keydome arrangement, which had a fairly flat profile as can be seen in FIG. 20b. When using a conventional key dome type arrangement, the user has to apply a constant force until the point where the key actuates. As a result, he does not get a tactile indication that he is nearing the position when actuation is likely to occur. In contrast, when using the device illustrated in FIGS. 17 and 18, the user can realise the fact that he is nearing the position when actuation is likely to occur as he is having to increase the force applied for a given travel of the key. Furthermore, the user is informed when actuation takes place, and again when deactuation takes place, by respective clicking sounds provided by the key.

The central V shaped key tips of the embodiment illustrated in FIG. 1 enable the user to determine the central vertical axis of the device both by sight and by touch. This is made even easier by the pillow 16 being provided with an apex. Consequently the user can quickly locate a desired central key. The apexes of each central key tip also identify the mid point along the length of the key tip, the point from which the key shaft 49 extends. Hence, they facilitate more accurate depression of the key. This, in turn, may assist in the prevention of contact with neighbouring key tips or the need to place keys further apart to prevent such contact.

Likewise, in this embodiment, the combination of adjacent outer key tips and front face protectors forming a V shape enable the user to determine the position of the vertical axes to one side of which the outer keys lie. Consequently, the user can quickly locate a desired outer key. The key location process is facilitated in this embodiment as the outer key tips extend to the interface between the second layer of the composite 51 and the bezel 19.

The front face of the device illustrated in FIG. 1 is protected by the pillow and front face protectors, 63. The front face 3 is slightly convex, with the highest points lying along its central longitudinal axis. Hence, ordinarily, if placed face down, the device would rest on this axis, resulting in scratches to its surface. Clearly, this is not acceptable, particularly when the second layer of composite is sapphire or the like. The device illustrated in FIG. 1 has been designed to avoid this problem. The pillow 16 and face protector 63a prevent the device resting on the second layer of composite. Also, as mentioned above, in the preferred embodiment the key tips protrude slightly from the surface. Hence, the central key tips too may protect the second layer of composite from damage. However, preferably the pillow 16 and chin front face protector 63a are raised sufficiently above the front surface, that the device does not rest on the central key tips either, so as to protect them from damage too.

The device is also designed so that the front face is protected if the edge of the face is knocked. As can be seen from the plan view of the d vice, depicted in FIG. 21, the bezel front face protectors 63b protrude beyond the surface of the second layer of composite along the interface with the bezel, thereby protecting the second layer of composite from damage in that region. They also reduce the likelihood of damage to the bezel due to knocks. Moreover, they protrude further than the adjacent key tips, hence protecting those key tips from damage too.

One further benefit of the front face protectors 63, particularly the bezel is that they are dimensioned so as to prevent the keys from being accidentally actuated if, for example, the device was placed face down. That is, the top surface of the front face protector tips should either be at the same level or higher than the top surface of a key tip (e.g. as in the relationship between the protectors 63b and the adjacent outer key tips) or, if they are at a lower level than the top surface of a key tip, the distance between the top surface of the protector and key tips must be smaller than the distance the key needs to travel in order for the spring plate contacts to contact the PCB contact region for actuation the key.

In order to commission a casing for a portable communications device there will be a list of designated casing elements the characteristics of which are selectable by a commissioning party. This list of possible parts for personalisation may be provided in amongst other ways on a computer, on a web site or as a paper list in a suitable store. The party commissioning the device can then select the characteristics of the designated elements from a set of possible options provided. In alternative embodiments the scope for originality in the characteristics of individual ones of the designated elements may be greater and the commissioner may be given a practically free hand in determining the material, and other additions such as surface decoration by etching or engraving and, amongst other things, encrustation.

The entire process could be computerised so that the selected characters of the device are readily conveyed to a manufacturing location or location for realisation of the selected characters for the designated elements. This could be via an intermediary that records the customers specifications for later use and utilises the skills of a range of craftspersons to make the required elements and co-ordinates the collocation of the individual elements for assembly. The device will be described in greater detail below with exemplary materials being given for specific elements of the device. Where a material or veneer is discussed in relation to an element, the reader should be aware that the particular character of the element described is one of many or several that may be provided as options to a party commissioning a personalised device. In addition the exact material or surface decoration of the element could be individually commissioned. As another option the specification of the commissioner could be directly forwarded to a location with the selected elements in stock for immediate assembly. In this embodiment either individually commissioned elements would not be possible at all or restricted to a relatively small number of tasks that can be performed after the initial materials and finish of an element have been decided, such as engraving and possibly jewel encrustation.

For greater freedom in individually commissioned elements, these elements could be individually designed and fabricated and finally forwarded for assembly with the less unique elements. Should assembly of the elements require particular skills or for perhaps other reasons the assembly may occur at yet another location.

The formed article is then conveyed to the end user.

In the future, although the casing will probably be maintained in substantially the same condition, the engine could be replaced with an engine that perhaps has greater processing power or allows for different functionality, for example improved graphics. To replace the engine will be a relatively simple manner of removing the existing engine and replacing it with a new one. the battery and internal casing walls may be changed at the same time if greater battery volume is then possible.

Aspects of the invention have been discussed with reference to a radio telephone function. It will be clear to the skilled man that these aspects apply equally to other portable communications devices supporting in addition or as an alternative other functions, such as, amongst others electronic diaries, and electronic notepads.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention.

The present invention includes any novel feature or combination of features disclosed herein either explicitly or any generalisation thereof irrespective of whether or not it relates to the claimed invention or mitigates any or all of the problems addressed.

The invention claimed is:

1. A casing comprising:
   an exterior;
   a substrate;
   a surface layer mounted on a defined area of the substrate leaving exposed areas;
   a housing configured so that the housing and the surface layer define the exterior of the casing; and
   a housing element for engaging the exposed areas of the substrate with the housing,
   wherein the surface layer is brittle relative to the substrate and the casing is for a portable communication device for receiving an engine for operation of the device.

2. A casing according to claim 1 wherein the surface layer and the housing are retained spaced one from the other.

3. A casing according to claim 1 wherein the device comprises an operating face having a display and/or a user input mechanism, the surface layer providing the operating face.

4. A casing according to claim 1 wherein the surface layer adheres to the substrate.

5. A casing according to claim 1 wherein the adherent is a UV curing adhesive.

6. A casing according to claim 1 wherein a flexible gasket is provided around the surface layer at the interface between the surface layer and the casing.

7. A casing according to claim 1 wherein the substrate is flexible relative to the surface layer.

8. A casing according to claim 1 wherein the surface layer is a precious stone.

9. A casing according to claim 1 wherein the surface layer is formed from sapphire or diamond or glass.

10. A casing according to claim 1 wherein the surface layer is formed from a ceramic material.

11. A casing according to claim 1 wherein the substrate is optically permeable.

12. A casing according to claim 1 wherein the optically permeable substrate is a light guide.

13. A casing according to claim 1 wherein the surface layer and the substrate have the same optical qualities.

14. A casing according to claim 1 wherein the surface layer and the substrate are the same colour.

15. A casing according to claim 1 wherein the surface layer is arranged on the substrate in segments with lateral discontinuities.

16. A casing according to claim 15 wherein the lateral discontinuities extend across the full lateral extent of the surface layer.

17. A casing according to claim 15 wherein the lateral discontinuities act as hinges.

18. A casing according to claim 15 wherein the lateral extending discontinuities are shaped to receive user input elements of an array for user input.

19. A casing according to claim 1 wherein the substrate is captured between a housing element overlaying the substrate and the rest of the housing elements.

20. A casing according to claim 19 wherein the substrate is gripped between the overlay and the rest of the housing to retain it in position.

21. A casing according to claim 20 wherein a connector is provided to pull the overlay to the housing and capture the substrate.

22. A casing according to claim 21 wherein the connector has a screw thread.

23. A casing according to claim 19 wherein the housing element overlaying the substrate protects the edges of the surface layer.

24. A casing according to claim 19 wherein a rail for concealing raw edges may be caught in position as the overlay and the rest of the housing are squeezed together.

25. A casing according to claim 19 wherein the overlay is a bezel that surrounds the surface layer for protecting the exposed edges of the surface layer.

26. A casing according to claim 1 wherein the communications device is a radio telephone.

27. A casing comprising:
an exterior;
a substrate
a surface layer mounted on a defined area of the substrate leaving exposed areas;
a housing configured so that the housing and the surface layer define the exterior of the casing; and
means for engaging the exposed areas of the substrate with the housing,
wherein the surface layer is brittle relative to the substrate and the casing is for a portable communication device for receiving an engine for operation of the device.

28. A casing according to claim 27 wherein the surface layer and the housing are retained spaced one from the other.

29. A casing according to claim 27 wherein the device comprises an operating face having a display and/or a user input mechanism, the surface layer providing the operating face.

30. A portable communication device comprising:
an exterior;
a casing for receiving an engine for operation of the device, the casing comprising;
a substrate;
a surface layer mounted on a defined area of the substrate leaving exposed areas;
a housing configured so that the housing and the surface layer, define the exterior of the casing; and
a housing element for engaging the exposed areas of the substrate with the housing,
wherein the surface layer is brittle relative to the substrate.

31. A casing according to claim 30 wherein the surface layer and the housing are retained spaced one from the other.

32. A casing according to claim 30 wherein the device comprises an operating face having a display and/or a user input mechanism, the surface layer providing the operating face.

* * * * *